(12) United States Patent
Tokuhiro et al.

(10) Patent No.: US 8,788,780 B2
(45) Date of Patent: Jul. 22, 2014

(54) SIGNAL RESTORATION CIRCUIT, LATENCY ADJUSTMENT CIRCUIT, MEMORY CONTROLLER, PROCESSOR, COMPUTER, SIGNAL RESTORATION METHOD, AND LATENCY ADJUSTMENT METHOD

(75) Inventors: Noriyuki Tokuhiro, Kawasaki (JP); Noriyuki Takahashi, Kawasaki (JP); Shinya Aiso, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 116 days.

(21) Appl. No.: 13/472,575

(22) Filed: May 16, 2012

(65) Prior Publication Data

US 2012/0226884 A1    Sep. 6, 2012

Related U.S. Application Data

(63) Continuation of application No. PCT/JP2009/071686, filed on Dec. 25, 2009.

(51) Int. Cl.
  *G06F 12/00* (2006.01)
  *G11C 11/4076* (2006.01)
  *G11C 7/22* (2006.01)

(52) U.S. Cl.
  CPC ........ *G11C 7/222* (2013.01); *G11C 2207/2272* (2013.01); *G11C 11/4076* (2013.01)
  USPC .......................................... 711/167; 711/162

(58) Field of Classification Search
  USPC ....................................................... 711/167
  See application file for complete search history.

(56) References Cited

U.S. PATENT DOCUMENTS

| 5,084,839 | A | 1/1992 | Young |
| 5,592,456 | A | 1/1997 | Miyashita et al. |
| 6,243,797 | B1 | 6/2001 | Merritt |
| 6,356,485 | B1 | 3/2002 | Proebsting |
| 6,397,312 | B1 | 5/2002 | Nakano et al. |
| 2005/0242850 | A1 | 11/2005 | Kawasaki |
| 2008/0043545 | A1 | 2/2008 | Vink et al. |
| 2009/0072871 | A1 | 3/2009 | Tokuhiro |
| 2009/0201045 | A1 | 8/2009 | Nose et al. |

FOREIGN PATENT DOCUMENTS

| EP | 0 866 555 A2 | 9/1998 |
| EP | 866555 A2 * | 9/1998 |
| JP | 05-258589 A | 10/1993 |
| JP | 07-169058 A | 7/1995 |
| JP | 10-190639 A | 7/1998 |
| JP | 11-025029 A | 1/1999 |

(Continued)

OTHER PUBLICATIONS

European Search Report application No. 09852589.2 dated Dec. 20, 2012.

(Continued)

*Primary Examiner* — Shawn X Gu
(74) *Attorney, Agent, or Firm* — Squire Patton Boggs (US) LLP

(57) ABSTRACT

A signal restoration circuit includes a storage configured to store input signals by disposing the input signals in an input order, the input signals being readable from the storage in the disposed order, and a storage controller configured to control delay time from an input of the input signal to an output in the storage based on delay information of the input signal.

19 Claims, 28 Drawing Sheets

(56) References Cited

FOREIGN PATENT DOCUMENTS

| JP | 11-167515 A | 6/1999 |
|---|---|---|
| JP | 2003-050739 A | 2/2003 |
| JP | 2003-099321 A | 4/2003 |
| JP | 2006-107352 A | 4/2006 |
| JP | 2007-164697 A | 6/2007 |
| JP | 2007-536773 A | 12/2007 |
| JP | 2008-071018 A | 3/2008 |
| JP | 2009-076991 A | 4/2009 |

OTHER PUBLICATIONS

International Search Report and Written Opinion corresponding to International Application No. PCT/JP2009/071686 dated Sep. 28, 2010.

Office Action dated Dec. 30, 2013, issued in corresponding Korean Patent Application No. 10-2012-7013046 (with English translation).

* cited by examiner

FIG.5

| No. | INPUT | DELAY SIGNAL | \multicolumn{16}{c|}{SIGNAL WRITING POSITION IN STORAGE (FIFO)} | OUTPUT |
|---|---|---|---|---|---|---|---|---|---|---|---|---|---|---|---|---|---|---|
| | | | -8 | -7 | -6 | -5 | -4 | -3 | -2 | -1 | 0 | 1 | 2 | 3 | 4 | 5 | 6 | 7 | |
| 0 | X | X | X | X | X | X | X | X | X | X | X | X | X | X | X | X | X | X | X |
| 1 | A | 0 | 0 | X | X | X | X | X | X | A | A | X | X | X | X | X | X | X | X |
| 2 | A | 0 | 0 | 0 | X | X | X | X | X | A | A | A | X | X | X | X | X | X | X |
| 3 | B | 0 | 0 | 0 | 0 | X | X | X | X | B | B | A | A | X | X | X | X | X | X |
| 4 | B | 0 | 0 | 0 | 0 | 0 | X | X | X | B | B | B | A | A | X | X | X | X | X |
| 5 | C | 0 | 0 | 0 | 0 | 0 | 0 | X | X | C | C | B | B | A | A | X | X | X | X |
| 6 | C | 0 | 0 | 0 | 0 | 0 | 0 | 0 | X | C | C | C | B | B | A | A | X | X | X |
| 7 | D | 0 | 0 | 0 | 0 | 0 | 0 | 0 | 0 | D | D | C | C | B | B | A | A | X | X |
| 8 | D | 0 | 0 | 0 | 0 | 0 | 0 | 0 | 0 | D | D | D | C | C | B | B | A | A | A |
| 9 | E | 0 | 0 | 0 | 0 | 0 | 0 | 0 | 0 | E | E | D | D | C | C | B | B | A | A |
| 10 | E | 0 | 0 | 0 | 0 | 0 | 0 | 0 | 0 | E | E | E | D | D | C | C | B | B | B |
| 11 | F | 0 | 0 | 0 | 0 | 0 | 0 | 0 | 0 | F | F | E | E | D | D | C | C | B | B |
| 12 | F | 0 | 0 | 0 | 0 | 0 | 0 | 0 | 0 | F | F | F | E | E | D | D | C | C | C |
| 13 | G | 0 | 0 | 0 | 0 | 0 | 0 | 0 | 0 | G | G | F | F | E | E | D | D | C | C |
| 14 | G | 0 | 0 | 0 | 0 | 0 | 0 | 0 | 0 | G | G | G | F | F | E | E | D | D | D |
| 15 | G | 1 | 0 | 0 | 0 | 0 | 0 | 0 | 0 | 0 | G | G | G | F | F | E | E | D | D |
| 16 | H | 1 | 0 | 0 | 0 | 0 | 0 | 0 | 0 | 0 | H | H | G | G | F | F | E | E | E |
| 17 | H | 1 | 0 | 0 | 0 | 0 | 0 | 0 | 0 | 0 | H | H | H | G | G | F | F | E | E |
| 18 | H | 2 | 0 | 0 | 0 | 0 | 0 | 0 | 0 | 0 | 0 | H | H | H | G | G | F | F | F |
| 19 | I | 2 | 0 | 0 | 0 | 0 | 0 | 0 | 0 | 0 | 0 | I | I | H | H | G | G | F | F |
| 20 | I | 2 | 0 | 0 | 0 | 0 | 0 | 0 | 0 | 0 | 0 | I | I | I | H | H | G | G | G |
| 21 | J | 2 | 0 | 0 | 0 | 0 | 0 | 0 | 0 | 0 | 0 | J | J | I | I | H | H | G | G |
| 22 | J | 2 | 0 | 0 | 0 | 0 | 0 | 0 | 0 | 0 | 0 | J | J | J | I | I | H | H | H |
| 23 | K | 2 | 0 | 0 | 0 | 0 | 0 | 0 | 0 | 0 | 0 | K | K | J | J | I | I | H | H |
| 24 | K | 2 | 0 | 0 | 0 | 0 | 0 | 0 | 0 | 0 | 0 | K | K | K | J | J | I | I | I |
| 25 | L | 2 | 0 | 0 | 0 | 0 | 0 | 0 | 0 | 0 | 0 | L | L | K | K | J | J | I | I |
| 26 | M | 1 | 0 | 0 | 0 | 0 | 0 | 0 | 0 | 0 | M | M | L | L | K | K | J | J | J |
| 27 | N | 0 | 0 | 0 | 0 | 0 | 0 | 0 | 0 | N | N | M | M | L | L | K | K | J | J |
| 28 | N | 0 | 0 | 0 | 0 | 0 | 0 | 0 | 0 | N | N | N | M | M | L | L | K | K | K |
| 29 | O | 0 | 0 | 0 | 0 | 0 | 0 | 0 | 0 | O | O | N | N | M | M | L | L | K | K |
| 30 | O | 0 | 0 | 0 | 0 | 0 | 0 | 0 | 0 | O | O | O | N | N | M | M | L | L | L |
| 31 | P | 0 | 0 | 0 | 0 | 0 | 0 | 0 | 0 | P | P | O | O | N | N | M | M | L | L |
| 32 | P | 0 | 0 | 0 | 0 | 0 | 0 | 0 | 0 | P | P | P | O | O | N | N | M | M | M |
| 33 | Q | 0 | 0 | 0 | 0 | 0 | 0 | 0 | 0 | Q | Q | P | P | O | O | N | N | M | M |
| 34 | Q | 0 | 0 | 0 | 0 | 0 | 0 | 0 | 0 | Q | Q | Q | P | P | O | O | N | N | N |
| 35 | R | 0 | 0 | 0 | 0 | 0 | 0 | 0 | 0 | R | R | Q | Q | P | P | O | O | N | N |
| 36 | S | -1 | 0 | 0 | 0 | 0 | 0 | 0 | S | S | R | R | Q | Q | P | P | O | O | O |
| 37 | S | -1 | 0 | 0 | 0 | 0 | 0 | 0 | S | S | S | R | R | Q | Q | P | P | O | O |
| 38 | T | -1 | 0 | 0 | 0 | 0 | 0 | 0 | T | T | S | S | R | R | Q | Q | P | P | P |
| 39 | T | -1 | 0 | 0 | 0 | 0 | 0 | 0 | T | T | T | S | S | R | R | Q | Q | P | P |
| 40 | U | -1 | 0 | 0 | 0 | 0 | 0 | 0 | U | U | T | T | S | S | R | R | Q | Q | Q |
| 41 | V | -2 | 0 | 0 | 0 | 0 | 0 | V | V | U | U | T | T | S | S | R | R | Q | Q |
| 42 | V | -2 | 0 | 0 | 0 | 0 | 0 | V | V | V | U | U | T | T | S | S | R | R | R |
| 43 | W | -2 | 0 | 0 | 0 | 0 | 0 | W | W | V | V | U | U | T | T | S | S | R | R |
| 44 | W | -2 | 0 | 0 | 0 | 0 | 0 | W | W | W | V | V | U | U | T | T | S | S | S |
| 45 | X | -2 | 0 | 0 | 0 | 0 | 0 | X | X | W | W | V | V | U | U | T | T | S | S |

FIG.9

| TIME | 12 INPUT | 14 DELAY SIGNAL | 16 OFFSET SIGNAL | 58 OFFSET-ADDED DELAY SIGNAL | 60 | | | | | | | | | | | | | | 20 OUTPUT |
|---|---|---|---|---|---|---|---|---|---|---|---|---|---|---|---|---|---|---|---|
| | | | | | -8 | -7 | -6 | -5 | -4 | -3 | -2 | -1 | 0 | 1 | 2 | 3 | 4 | 5 | 6 | 7 | |
| 0 | X | X | 0 | X | X | X | X | X | X | X | X | X | X | X | X | X | X | X | X | X | X |
| 1 | A | 0 | 0 | 0 | 0 | X | X | X | X | X | X | A | A | X | X | X | X | X | X | X | X |
| 2 | A | 0 | 0 | 0 | 0 | 0 | X | X | X | X | X | A | A | A | X | X | X | X | X | X | X |
| 3 | B | 0 | 0 | 0 | 0 | 0 | 0 | X | X | X | X | B | B | A | A | X | X | X | X | X | X |
| 4 | B | 0 | 0 | 0 | 0 | 0 | 0 | 0 | X | X | X | B | B | B | A | A | X | X | X | X | X |
| 5 | C | 0 | 0 | 0 | 0 | 0 | 0 | 0 | 0 | X | X | C | C | B | B | A | A | X | X | X | X |
| 6 | C | 0 | 0 | 0 | 0 | 0 | 0 | 0 | 0 | 0 | X | C | C | C | B | B | A | A | X | X | X |
| 7 | D | 0 | 0 | 0 | 0 | 0 | 0 | 0 | 0 | 0 | 0 | D | D | C | C | B | B | A | A | X | X |
| 8 | D | 0 | 0 | 0 | 0 | 0 | 0 | 0 | 0 | 0 | 0 | D | D | D | C | C | B | B | A | A | A |
| 9 | E | 0 | 0 | 0 | 0 | 0 | 0 | 0 | 0 | 0 | 0 | E | E | D | D | C | C | B | B | A | A |
| 10 | E | 0 | 0 | 0 | 0 | 0 | 0 | 0 | 0 | 0 | 0 | E | E | E | D | D | C | C | B | B | B |
| 11 | F | 0 | 0 | 0 | 0 | 0 | 0 | 0 | 0 | 0 | 0 | F | F | E | E | D | D | C | C | B | B |
| 12 | F | 0 | 0 | 0 | 0 | 0 | 0 | 0 | 0 | 0 | 0 | F | F | F | E | E | D | D | C | C | C |
| 13 | G | 0 | 0 | 0 | 0 | 0 | 0 | 0 | 0 | 0 | 0 | G | G | F | F | E | E | D | D | C | C |
| 14 | G | 0 | 0 | 0 | 0 | 0 | 0 | 0 | 0 | 0 | 0 | G | G | G | F | F | E | E | D | D | D |
| 15 | G | 1 | 0 | 1 | 0 | 0 | 0 | 0 | 0 | 0 | 0 | 0 | G | G | G | F | F | E | E | D | D |
| 16 | H | 1 | 0 | 1 | 0 | 0 | 0 | 0 | 0 | 0 | 0 | 0 | H | H | G | G | F | F | E | E | E |
| 17 | H | 1 | 0 | 1 | 0 | 0 | 0 | 0 | 0 | 0 | 0 | 0 | H | H | H | G | G | F | F | E | E |
| 18 | H | 2 | 0 | 2 | 0 | 0 | 0 | 0 | 0 | 0 | 0 | 0 | 0 | H | H | G | G | F | F | F |
| 19 | I | 2 | 0 | 2 | 0 | 0 | 0 | 0 | 0 | 0 | 0 | 0 | 0 | I | I | H | H | G | G | F |
| 20 | I | 2 | 0 | 2 | 0 | 0 | 0 | 0 | 0 | 0 | 0 | 0 | 0 | I | I | I | H | H | G | G |
| 21 | J | 2 | 0 | 2 | 0 | 0 | 0 | 0 | 0 | 0 | 0 | 0 | 0 | J | J | I | I | H | H | G |
| 22 | J | 2 | 0 | 2 | 0 | 0 | 0 | 0 | 0 | 0 | 0 | 0 | 0 | J | J | J | I | I | H | H |
| 23 | K | 2 | 0 | 2 | 0 | 0 | 0 | 0 | 0 | 0 | 0 | 0 | 0 | K | K | J | J | I | I | H |
| 24 | K | 2 | 0 | 2 | 0 | 0 | 0 | 0 | 0 | 0 | 0 | 0 | 0 | K | K | K | J | J | I | I |
| 25 | L | 2 | 0 | 2 | 0 | 0 | 0 | 0 | 0 | 0 | 0 | 0 | 0 | L | L | K | K | J | J | I |
| 26 | M | 1 | 0 | 1 | 0 | 0 | 0 | 0 | 0 | 0 | 0 | 0 | M | M | L | L | K | K | J | J |
| 27 | N | 0 | 0 | 0 | 0 | 0 | 0 | 0 | 0 | 0 | 0 | N | N | M | M | L | L | K | K | J |
| 28 | N | 0 | 0 | 0 | 0 | 0 | 0 | 0 | 0 | 0 | 0 | N | N | N | M | M | L | L | K | K |
| 29 | O | 0 | 0 | 0 | 0 | 0 | 0 | 0 | 0 | 0 | 0 | O | O | N | N | M | M | L | L | K |
| 30 | O | 0 | 0 | 0 | 0 | 0 | 0 | 0 | 0 | 0 | 0 | O | O | O | N | N | M | M | L | L |
| 31 | P | 0 | 0 | 0 | 0 | 0 | 0 | 0 | 0 | 0 | 0 | P | P | O | O | N | N | M | M | L |
| 32 | P | 0 | 0 | 0 | 0 | 0 | 0 | 0 | 0 | 0 | 0 | P | P | P | O | O | N | N | M | M |
| 33 | Q | 0 | 0 | 0 | 0 | 0 | 0 | 0 | 0 | 0 | 0 | Q | Q | P | P | O | O | N | N | M |
| 34 | Q | 0 | 0 | 0 | 0 | 0 | 0 | 0 | 0 | 0 | 0 | Q | Q | Q | P | P | O | O | N | N |
| 35 | R | 0 | 0 | 0 | 0 | 0 | 0 | 0 | 0 | 0 | 0 | R | R | Q | Q | P | P | O | O | N |
| 36 | S | -1 | 0 | -1 | 0 | 0 | 0 | 0 | 0 | 0 | 0 | S | S | R | R | Q | P | P | O | O |
| 37 | S | -1 | 0 | -1 | 0 | 0 | 0 | 0 | 0 | 0 | 0 | S | S | S | R | R | Q | P | P | O |
| 38 | T | -1 | 0 | -1 | 0 | 0 | 0 | 0 | 0 | 0 | 0 | T | T | S | S | R | R | Q | P | P |
| 39 | T | -1 | 0 | -1 | 0 | 0 | 0 | 0 | 0 | 0 | 0 | T | T | T | S | S | R | R | Q | P |
| 40 | U | -1 | 0 | -1 | 0 | 0 | 0 | 0 | 0 | 0 | 0 | U | U | T | T | S | S | R | R | Q |
| 41 | V | -2 | 0 | -2 | 0 | 0 | 0 | 0 | 0 | 0 | V | V | U | U | T | T | S | S | R | Q |
| 42 | V | -2 | 0 | -2 | 0 | 0 | 0 | 0 | 0 | 0 | V | V | V | U | U | T | T | S | S | R |
| 43 | W | -2 | 0 | -2 | 0 | 0 | 0 | 0 | 0 | 0 | W | W | V | V | U | U | T | T | S | R |
| 44 | W | -2 | 0 | -2 | 0 | 0 | 0 | 0 | 0 | 0 | W | W | W | V | V | U | U | T | T | S |
| 45 | X | -2 | 0 | -2 | 0 | 0 | 0 | 0 | 0 | 0 | X | X | W | W | V | V | U | U | T | S |

10B [Offset=0]

18: SIGNAL WRITING POSITION IN STORAGE (FIFO)

FIG.10

10C [Offset=1]

| TIME | 12 INPUT | 14 DELAY SIGNAL | 16 OFFSET SIGNAL | 58 OFFSET-ADDED DELAY SIGNAL | 18 SIGNAL WRITING POSITION IN STORAGE (FIFO) | | | | | | | | | | | | | | | | 20 OUTPUT |
|---|---|---|---|---|---|---|---|---|---|---|---|---|---|---|---|---|---|---|---|---|---|
| | | | | | -8 | -7 | -6 | -5 | -4 | -3 | -2 | -1 | 0 | 1 | 2 | 3 | 4 | 5 | 6 | 7 | |
| 0 | X | X | 1 | X | X | X | X | X | X | X | X | X | X | X | X | X | X | X | X | X | X |
| 1 | A | 0 | 1 | 1 | 0 | X | X | X | X | X | X | X | A | A | X | X | X | X | X | X | X |
| 2 | A | 0 | 1 | 1 | 0 | 0 | X | X | X | X | X | X | A | A | A | X | X | X | X | X | X |
| 3 | B | 0 | 1 | 1 | 0 | 0 | 0 | X | X | X | X | X | B | B | A | A | X | X | X | X | X |
| 4 | B | 0 | 1 | 1 | 0 | 0 | 0 | 0 | X | X | X | X | B | B | B | A | A | X | X | X | X |
| 5 | C | 0 | 1 | 1 | 0 | 0 | 0 | 0 | 0 | X | X | X | C | C | B | B | A | A | X | X | X |
| 6 | C | 0 | 1 | 1 | 0 | 0 | 0 | 0 | 0 | 0 | X | X | C | C | C | B | B | A | A | X | X |
| 7 | D | 0 | 1 | 1 | 0 | 0 | 0 | 0 | 0 | 0 | 0 | X | D | D | C | C | B | B | A | A | A |
| 8 | D | 0 | 1 | 1 | 0 | 0 | 0 | 0 | 0 | 0 | 0 | 0 | D | D | D | C | C | B | B | A | A |
| 9 | E | 0 | 1 | 1 | 0 | 0 | 0 | 0 | 0 | 0 | 0 | 0 | E | E | D | D | C | C | B | B | B |
| 10 | E | 0 | 1 | 1 | 0 | 0 | 0 | 0 | 0 | 0 | 0 | 0 | E | E | E | D | D | C | C | B | B |
| 11 | F | 0 | 1 | 1 | 0 | 0 | 0 | 0 | 0 | 0 | 0 | 0 | F | F | E | E | D | D | C | C | C |
| 12 | F | 0 | 1 | 1 | 0 | 0 | 0 | 0 | 0 | 0 | 0 | 0 | F | F | F | E | E | D | D | C | C |
| 13 | G | 0 | 1 | 1 | 0 | 0 | 0 | 0 | 0 | 0 | 0 | 0 | G | G | F | F | E | E | D | D | D |
| 14 | G | 0 | 1 | 1 | 0 | 0 | 0 | 0 | 0 | 0 | 0 | 0 | G | G | G | F | F | E | E | D | D |
| 15 | G | 1 | 1 | 2 | 0 | 0 | 0 | 0 | 0 | 0 | 0 | 0 | 0 | G | G | G | F | F | E | E | E |
| 16 | H | 1 | 1 | 2 | 0 | 0 | 0 | 0 | 0 | 0 | 0 | 0 | 0 | H | H | G | G | F | F | E | E |
| 17 | H | 1 | 1 | 2 | 0 | 0 | 0 | 0 | 0 | 0 | 0 | 0 | 0 | H | H | H | G | G | F | F | F |
| 18 | H | 2 | 1 | 3 | 0 | 0 | 0 | 0 | 0 | 0 | 0 | 0 | 0 | 0 | H | H | H | G | G | F | F |
| 19 | I | 2 | 1 | 3 | 0 | 0 | 0 | 0 | 0 | 0 | 0 | 0 | 0 | 0 | I | I | H | H | G | G | G |
| 20 | I | 2 | 1 | 3 | 0 | 0 | 0 | 0 | 0 | 0 | 0 | 0 | 0 | 0 | I | I | I | H | H | G | G |
| 21 | J | 2 | 1 | 3 | 0 | 0 | 0 | 0 | 0 | 0 | 0 | 0 | 0 | 0 | J | J | I | I | H | H | H |
| 22 | J | 2 | 1 | 3 | 0 | 0 | 0 | 0 | 0 | 0 | 0 | 0 | 0 | 0 | J | J | J | I | I | H | H |
| 23 | K | 2 | 1 | 3 | 0 | 0 | 0 | 0 | 0 | 0 | 0 | 0 | 0 | 0 | K | K | J | J | I | I | I |
| 24 | K | 2 | 1 | 3 | 0 | 0 | 0 | 0 | 0 | 0 | 0 | 0 | 0 | 0 | K | K | K | J | J | I | I |
| 25 | L | 2 | 1 | 3 | 0 | 0 | 0 | 0 | 0 | 0 | 0 | 0 | 0 | 0 | L | L | K | K | J | J | J |
| 26 | M | 1 | 1 | 2 | 0 | 0 | 0 | 0 | 0 | 0 | 0 | 0 | 0 | M | M | L | L | K | K | J | J |
| 27 | N | 0 | 1 | 1 | 0 | 0 | 0 | 0 | 0 | 0 | 0 | 0 | N | N | M | M | L | L | K | K | K |
| 28 | N | 0 | 1 | 1 | 0 | 0 | 0 | 0 | 0 | 0 | 0 | 0 | N | N | N | M | M | L | L | K | K |
| 29 | O | 0 | 1 | 1 | 0 | 0 | 0 | 0 | 0 | 0 | 0 | 0 | O | O | N | N | M | M | L | L | L |
| 30 | O | 0 | 1 | 1 | 0 | 0 | 0 | 0 | 0 | 0 | 0 | 0 | O | O | O | N | N | M | M | L | L |
| 31 | P | 0 | 1 | 1 | 0 | 0 | 0 | 0 | 0 | 0 | 0 | 0 | P | P | O | O | N | N | M | M | M |
| 32 | P | 0 | 1 | 1 | 0 | 0 | 0 | 0 | 0 | 0 | 0 | 0 | P | P | P | O | O | N | N | M | M |
| 33 | Q | 0 | 1 | 1 | 0 | 0 | 0 | 0 | 0 | 0 | 0 | 0 | Q | Q | P | P | O | O | N | N | N |
| 34 | Q | 0 | 1 | 1 | 0 | 0 | 0 | 0 | 0 | 0 | 0 | 0 | Q | Q | Q | P | P | O | O | N | N |
| 35 | R | 0 | 1 | 1 | 0 | 0 | 0 | 0 | 0 | 0 | 0 | 0 | R | R | Q | Q | P | P | O | O | O |
| 36 | S | -1 | 1 | 0 | 0 | 0 | 0 | 0 | 0 | 0 | 0 | S | S | R | R | Q | Q | P | P | O | O |
| 37 | S | -1 | 1 | 0 | 0 | 0 | 0 | 0 | 0 | 0 | 0 | S | S | S | R | R | Q | Q | P | P | P |
| 38 | T | -1 | 1 | 0 | 0 | 0 | 0 | 0 | 0 | 0 | 0 | T | T | S | S | R | R | Q | P | P | P |
| 39 | T | -1 | 1 | 0 | 0 | 0 | 0 | 0 | 0 | 0 | 0 | T | T | T | S | S | R | R | Q | Q | Q |
| 40 | U | -1 | 1 | 0 | 0 | 0 | 0 | 0 | 0 | 0 | 0 | U | U | T | T | S | S | R | R | Q | Q |
| 41 | V | -2 | 1 | -1 | 0 | 0 | 0 | 0 | 0 | 0 | 0 | V | V | U | U | T | T | S | S | R | R |
| 42 | V | -2 | 1 | -1 | 0 | 0 | 0 | 0 | 0 | 0 | 0 | V | V | V | U | U | T | T | S | S | R |
| 43 | W | -2 | 1 | -1 | 0 | 0 | 0 | 0 | 0 | 0 | 0 | W | W | V | V | U | U | T | T | S | S |
| 44 | W | -2 | 1 | -1 | 0 | 0 | 0 | 0 | 0 | 0 | 0 | W | W | W | V | V | U | U | T | T | S |
| 45 | X | -2 | 1 | -1 | 0 | 0 | 0 | 0 | 0 | 0 | 0 | X | X | W | W | V | V | U | U | T | T |

FIG.11

10D [Offset=5]

| TIME | 12 INPUT | 14 DELAY SIGNAL | 16 OFFSET SIGNAL | 58 OFFSET-ADDED DELAY SIGNAL | \multicolumn{16}{c|}{18 SIGNAL WRITING POSITION IN STORAGE (FIFO)} | 20 OUTPUT |
|---|---|---|---|---|---|---|---|---|---|---|---|---|---|---|---|---|---|---|---|---|
| | | | | | -8 | -7 | -6 | -5 | -4 | -3 | -2 | -1 | 0 | 1 | 2 | 3 | 4 | 5 | 6 | 7 | |
| 0 | X | X | 5 | X | X | X | X | X | X | X | X | X | X | X | X | X | X | X | X | X | X |
| 1 | A | 0 | 5 | 5 | 0 | X | X | X | X | X | X | X | X | X | X | X | A | A | X | X | X |
| 2 | A | 0 | 5 | 5 | 0 | 0 | X | X | X | X | X | X | X | X | X | X | A | A | A | X | X |
| 3 | B | 0 | 5 | 5 | 0 | 0 | 0 | X | X | X | X | X | X | X | X | X | B | B | A | A | A |
| 4 | B | 0 | 5 | 5 | 0 | 0 | 0 | 0 | X | X | X | X | X | X | X | X | B | B | B | A | A |
| 5 | C | 0 | 5 | 5 | 0 | 0 | 0 | 0 | 0 | X | X | X | X | X | X | X | C | C | B | B | B |
| 6 | C | 0 | 5 | 5 | 0 | 0 | 0 | 0 | 0 | 0 | X | X | X | X | X | X | C | C | C | B | B |
| 7 | D | 0 | 5 | 5 | 0 | 0 | 0 | 0 | 0 | 0 | 0 | X | X | X | X | X | D | D | C | C | C |
| 8 | D | 0 | 5 | 5 | 0 | 0 | 0 | 0 | 0 | 0 | 0 | 0 | X | X | X | X | D | D | D | C | C |
| 9 | E | 0 | 5 | 5 | 0 | 0 | 0 | 0 | 0 | 0 | 0 | 0 | 0 | X | X | X | E | E | D | D | D |
| 10 | E | 0 | 5 | 5 | 0 | 0 | 0 | 0 | 0 | 0 | 0 | 0 | 0 | 0 | X | X | E | E | E | D | D |
| 11 | F | 0 | 5 | 5 | 0 | 0 | 0 | 0 | 0 | 0 | 0 | 0 | 0 | 0 | 0 | X | F | F | E | E | E |
| 12 | F | 0 | 5 | 5 | 0 | 0 | 0 | 0 | 0 | 0 | 0 | 0 | 0 | 0 | 0 | 0 | F | F | F | E | E |
| 13 | G | 0 | 5 | 5 | 0 | 0 | 0 | 0 | 0 | 0 | 0 | 0 | 0 | 0 | 0 | 0 | G | G | F | F | F |
| 14 | G | 0 | 5 | 5 | 0 | 0 | 0 | 0 | 0 | 0 | 0 | 0 | 0 | 0 | 0 | 0 | G | G | G | F | F |
| 15 | G | 1 | 5 | 6 | 0 | 0 | 0 | 0 | 0 | 0 | 0 | 0 | 0 | 0 | 0 | 0 | 0 | G | G | G | G |
| 16 | H | 1 | 5 | 6 | 0 | 0 | 0 | 0 | 0 | 0 | 0 | 0 | 0 | 0 | 0 | 0 | 0 | H | H | G | G |
| 17 | H | 1 | 5 | 6 | 0 | 0 | 0 | 0 | 0 | 0 | 0 | 0 | 0 | 0 | 0 | 0 | 0 | H | H | H | H |
| 18 | H | 2 | 5 | 7 | 0 | 0 | 0 | 0 | 0 | 0 | 0 | 0 | 0 | 0 | 0 | 0 | 0 | 0 | H | H | H |
| 19 | I | 2 | 5 | 7 | 0 | 0 | 0 | 0 | 0 | 0 | 0 | 0 | 0 | 0 | 0 | 0 | 0 | 0 | I | I | I |
| 20 | I | 2 | 5 | 7 | 0 | 0 | 0 | 0 | 0 | 0 | 0 | 0 | 0 | 0 | 0 | 0 | 0 | 0 | I | I | I |
| 21 | J | 2 | 5 | 7 | 0 | 0 | 0 | 0 | 0 | 0 | 0 | 0 | 0 | 0 | 0 | 0 | 0 | 0 | J | J | J |
| 22 | J | 2 | 5 | 7 | 0 | 0 | 0 | 0 | 0 | 0 | 0 | 0 | 0 | 0 | 0 | 0 | 0 | 0 | J | J | J |
| 23 | K | 2 | 5 | 7 | 0 | 0 | 0 | 0 | 0 | 0 | 0 | 0 | 0 | 0 | 0 | 0 | 0 | 0 | K | K | K |
| 24 | K | 2 | 5 | 7 | 0 | 0 | 0 | 0 | 0 | 0 | 0 | 0 | 0 | 0 | 0 | 0 | 0 | 0 | K | K | K |
| 25 | L | 2 | 5 | 7 | 0 | 0 | 0 | 0 | 0 | 0 | 0 | 0 | 0 | 0 | 0 | 0 | 0 | 0 | L | L | L |
| 26 | M | 1 | 5 | 6 | 0 | 0 | 0 | 0 | 0 | 0 | 0 | 0 | 0 | 0 | 0 | 0 | 0 | M | M | L | L |
| 27 | N | 0 | 5 | 5 | 0 | 0 | 0 | 0 | 0 | 0 | 0 | 0 | 0 | 0 | 0 | 0 | N | N | M | M | M |
| 28 | N | 0 | 5 | 5 | 0 | 0 | 0 | 0 | 0 | 0 | 0 | 0 | 0 | 0 | 0 | 0 | N | N | N | M | M |
| 29 | O | 0 | 5 | 5 | 0 | 0 | 0 | 0 | 0 | 0 | 0 | 0 | 0 | 0 | 0 | 0 | O | O | N | N | N |
| 30 | O | 0 | 5 | 5 | 0 | 0 | 0 | 0 | 0 | 0 | 0 | 0 | 0 | 0 | 0 | 0 | O | O | O | N | N |
| 31 | P | 0 | 5 | 5 | 0 | 0 | 0 | 0 | 0 | 0 | 0 | 0 | 0 | 0 | 0 | 0 | P | P | O | O | O |
| 32 | P | 0 | 5 | 5 | 0 | 0 | 0 | 0 | 0 | 0 | 0 | 0 | 0 | 0 | 0 | 0 | P | P | P | O | O |
| 33 | Q | 0 | 5 | 5 | 0 | 0 | 0 | 0 | 0 | 0 | 0 | 0 | 0 | 0 | 0 | 0 | Q | Q | P | P | P |
| 34 | Q | 0 | 5 | 5 | 0 | 0 | 0 | 0 | 0 | 0 | 0 | 0 | 0 | 0 | 0 | 0 | Q | Q | Q | P | P |
| 35 | R | 0 | 5 | 5 | 0 | 0 | 0 | 0 | 0 | 0 | 0 | 0 | 0 | 0 | 0 | 0 | R | R | Q | Q | Q |
| 36 | S | -1 | 5 | 4 | 0 | 0 | 0 | 0 | 0 | 0 | 0 | 0 | 0 | 0 | 0 | S | S | R | R | Q | Q |
| 37 | S | -1 | 5 | 4 | 0 | 0 | 0 | 0 | 0 | 0 | 0 | 0 | 0 | 0 | 0 | S | S | S | R | R | R |
| 38 | T | -1 | 5 | 4 | 0 | 0 | 0 | 0 | 0 | 0 | 0 | 0 | 0 | 0 | 0 | T | T | S | S | R | R |
| 39 | T | -1 | 5 | 4 | 0 | 0 | 0 | 0 | 0 | 0 | 0 | 0 | 0 | 0 | 0 | T | T | T | S | S | S |
| 40 | U | -1 | 5 | 4 | 0 | 0 | 0 | 0 | 0 | 0 | 0 | 0 | 0 | 0 | 0 | U | U | T | T | S | S |
| 41 | V | -2 | 5 | 3 | 0 | 0 | 0 | 0 | 0 | 0 | 0 | 0 | 0 | 0 | V | V | U | U | T | T | T |
| 42 | V | -2 | 5 | 3 | 0 | 0 | 0 | 0 | 0 | 0 | 0 | 0 | 0 | 0 | V | V | V | U | U | T | T |
| 43 | W | -2 | 5 | 3 | 0 | 0 | 0 | 0 | 0 | 0 | 0 | 0 | 0 | 0 | W | W | V | V | U | U | U |
| 44 | W | -2 | 5 | 3 | 0 | 0 | 0 | 0 | 0 | 0 | 0 | 0 | 0 | 0 | W | W | W | V | V | U | U |
| 45 | X | -2 | 5 | 3 | 0 | 0 | 0 | 0 | 0 | 0 | 0 | 0 | 0 | 0 | X | X | W | W | V | V | V |

FIG.26

| PARAMETER | LSI INTERNAL CLOCK SIDE (CLOCK TREE SIDE) | DATA RECEIVING SIDE (SIGNAL RECEIVING SIDE) |
|---|---|---|
| (1) CLOCK TREE PART | 1,000ps +/-100ps | 1,000ps +/-100ps |
| (2) OUTPUT BUFFER DELAY IN DDR SIGNAL RECEIVING PART | | 1,000ps +/-500ps |
| (3) DELAY IN TRANSMISSION PATH (SIGNAL RECEIVING PART → DIMM) | | 7.3x TRANSMISSION LENGTH +/-10% |
| (4) DIMM CK INPUT-DQS OUTPUT DELAY, tDQSCK | | +/-265ps |
| (5) DELAY IN TRANSMISSION PATH (DIMM → SIGNAL RECEIVING PART) | | 7.3x TRANSMISSION LENGTH +/-10% |
| (6) INPUT BUFFER DELAY IN DDR SIGNAL RECEIVING PART | | 1,000ps +/-500ps |
| (7) DELAY IN DL (a) (NUMBER OBTAINED WHEN SHIFTING 3/4 CYCLE) | | 469ps +/-72ps |
| (8) FF PROPAGATION DELAY | | 100ps +/-50ps |
| Total | 1,000ps +/-100ps | 3,569ps +/-1,925ps |

SIGNAL RESTORATION CIRCUIT, LATENCY ADJUSTMENT CIRCUIT, MEMORY CONTROLLER, PROCESSOR, COMPUTER, SIGNAL RESTORATION METHOD, AND LATENCY ADJUSTMENT METHOD

CROSS-REFERENCE TO RELATED APPLICATIONS

The present application is a U.S. continuation application filed under 35 USC 111(a) claiming benefit under 35 U.S.C. 120 and 365(c) of PCT International Application No. PCT/JP2009/071686 filed on Dec. 25, 2009, the entire contents of which are incorporated herein by reference.

FIELD

The embodiments discussed herein are related to a circuit to restore a signal, and more specifically, to a signal restoration circuit for use in signal processing such as restoring a sending side signal from a received signal having phase variation or restoring a pulse width of a pulse signal, a latency adjustment circuit, a memory controller, a processor, a computer, a signal restoration method, and a latency adjustment method.

BACKGROUND

A signal restoration circuit is utilized for restoring a sending side signal based on a received signal when the received signal includes phase fluctuation. For example, there is a double data rate (DDR) memory interface circuit. The DDR memory is configured to input or output data both at a positive edge and a negative edge of a clock (CK) signal such that the data are transferred at a data transfer rates twice the speed of the clock frequency.

Such a DDR memory sends an internal clock (CK) signal from a memory controller to a dual inline memory module (DIMM). The DIMM generates a data strobe (DQS) signal from the CK signal and sends the DQS signal together with the data (DQ) signal to the memory controller. The memory controller receives the DQS signal and DQ signal, fetches the DQ signal based on the DQS signal and then transfers to an internal clock. At this moment, it may be necessary for a timing relationship between the internal CK signal and a receiving data signal to fall within a constant range in order to receive the data signal securely at a receiving point of a latch circuit.

In the signal restoration of the memory controller, there is disclosed a technique in which a clock having a phase differing from that of a reference clock is generated within the memory controller and the data strobe signal is delayed based on the generated clock phase (Patent Document 1).

Further, there is disclosed a technique in which the first and second timing signals having delayed the data strobe signal are generated and the signal unstable state is prevented by selectively utilizing the generated first and the second timing signals (Patent Document 2).

Moreover, there is disclosed a technique in which the read data are acquired at a changing edge of the data strobe signal in the memory controller (Patent Document 3).

Further, there is disclosed a technique in which a phase difference between the data strobe signal and the read clock is measured, delay time of the clock signal is adjusted based on the measured phase difference and the data signal is acquired in synchronization with the adjusted clock signal (Patent Document 4).

Moreover, there is disclosed a technique in which the phase of the clock that latches the data is shifted when the data are read from the memory (Patent Document 5).

In addition, there are disclosed techniques in which the data read from the memory and the data written in the memory are compared, and the clock phase used for reading the data is determined such that the read data matches the written data (Patent Document 6), the amount of the phase of the data strobe signal is determined (Patent Document 7), or the writing timing is determined such that the read data matches the written data (Patent Document 8).

Further, in the data regeneration, there is disclosed a technique in which the first-in first-out (FIFO) system is utilized for regenerating a pulse width based on the detected pulses at the data rising edge and the data falling edge (Patent Document 9).

RELATED ART DOCUMENT

Patent Document

Patent Document 1: Japanese National Publication of International Patent Application No. 2007-536773
Patent Document 2: Japanese Laid-open Patent Publication No. 2006-107352
Patent Document 3: Japanese Laid-open Patent Publication No. 11-25029
Patent Document 4: Japanese Laid-open Patent Publication No. 2008-71018
Patent Document 5: Japanese Laid-open Patent Publication No. 2007-164697
Patent Document 6: Japanese Laid-open Patent Publication No. 2003-50739
Patent Document 7: Japanese Laid-open Patent Publication No. 2003-99321
Patent Document 8: Japanese Laid-open Patent Publication No. 11-167515
Patent Document 9: Japanese Laid-open Patent Publication No. 7-169058

In signal transmission, various delays may occur due to the temperature differences or different transmission routes. When such a signal delay is corrected, the received signal may differ from the original signal due to the timing of the correction. Such a signal difference may corrupt reliability of operations in the memory. For example, when the data received from the memory differs from the original data, reliability in data processing may be corrupted.

SUMMARY

According to an aspect of an embodiment, there is provided a signal restoration circuit that includes a storage configured to store input signals by disposing the input signals in an input order, the input signals being readable from the storage in the disposed order; and a storage controller configured to control the delay time from an input of the input signal to an output in the storage based on delay information of the input signal.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF DRAWINGS

FIG. 5 is a diagram illustrating an example of signal restoration processing;

FIG. 9 is a diagram illustrating an example of signal restoration processing;

FIG. 10 is a diagram illustrating an example of signal restoration processing;

FIG. 11 is a diagram illustrating an example of signal restoration processing;

FIG. 26 is a diagram illustrating an estimation example of delay variability of a circuit;

DESCRIPTION OF EMBODIMENTS

First Embodiment

A first embodiment represents a basic configuration of a signal restoration circuit disclosed herein. That is, the signal restoration circuit includes a storage and a storage controller as a basic configuration.

Figure 1:
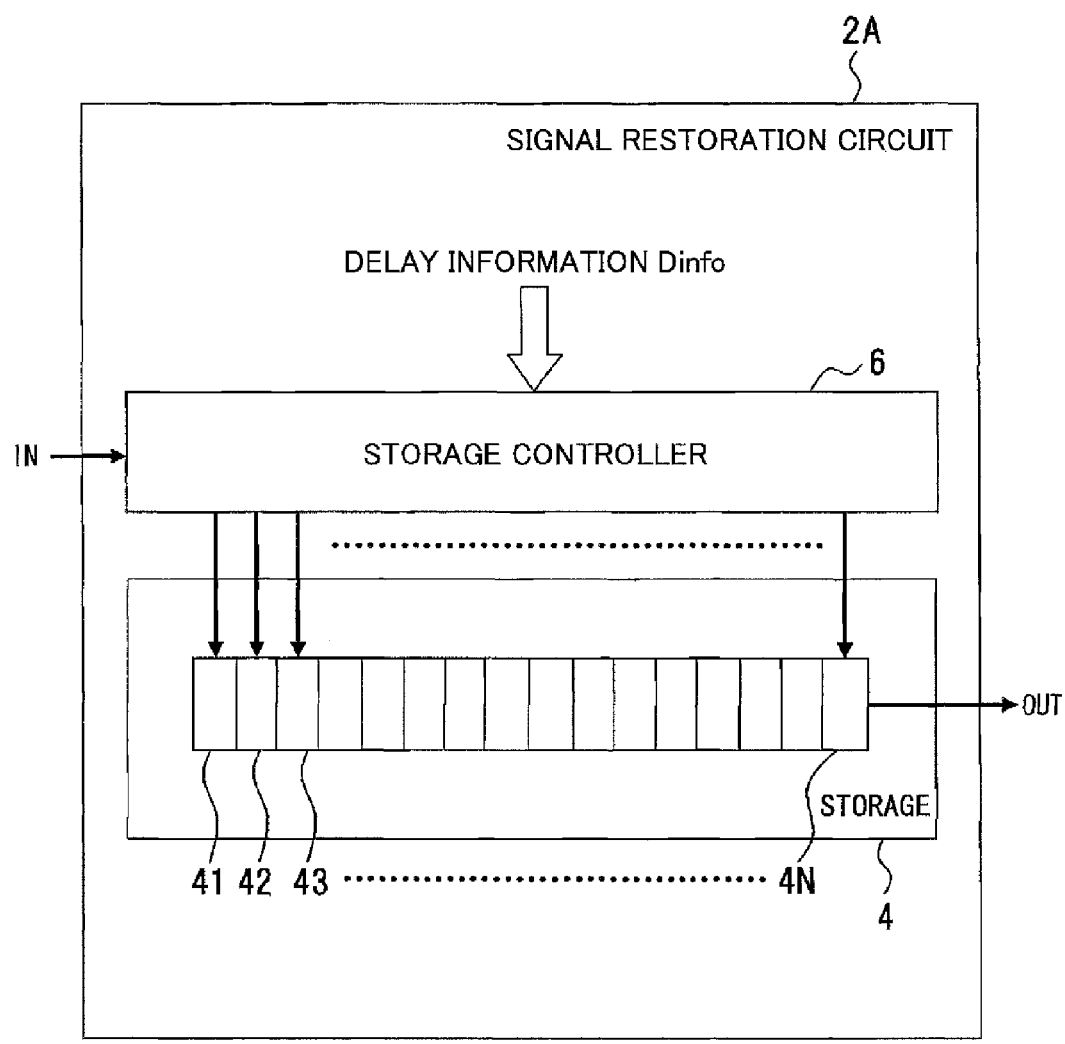
FIG. 1 is a diagram illustrating an example of a signal restoration circuit according to a first embodiment.
Figure 2:
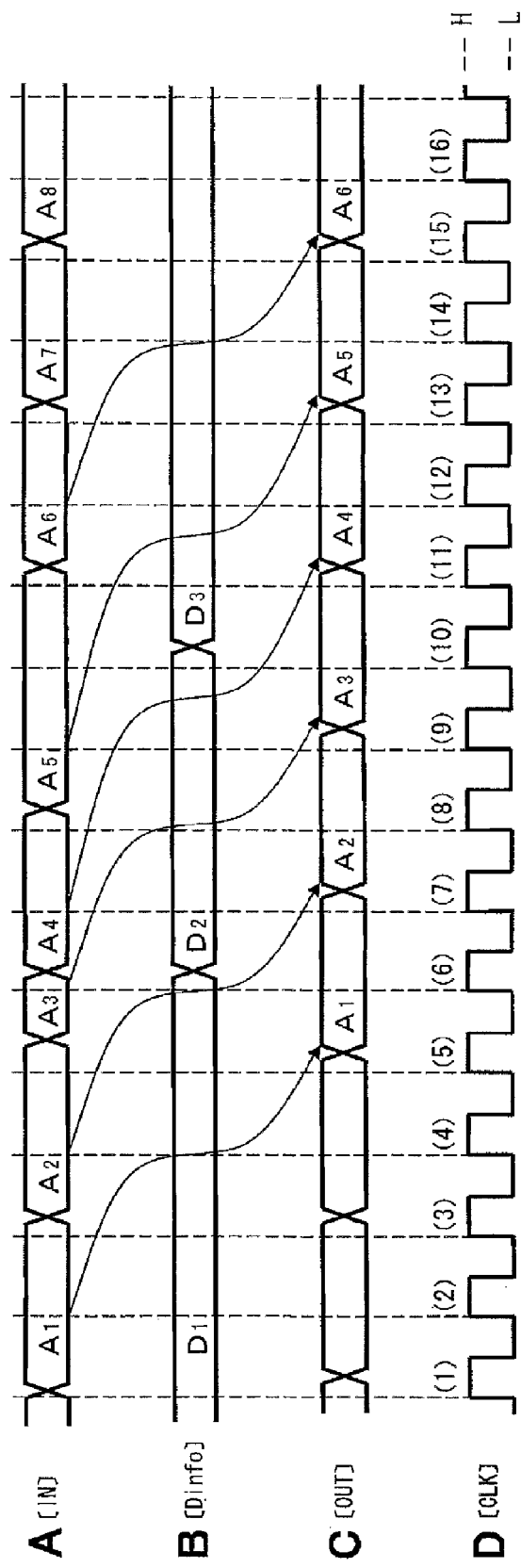
FIG. 2 is a timing-chart illustrating a signal restoration operation.

The first embodiment is described with reference to FIGS. 1 and 2. FIG. 1 is a diagram illustrating an example of a signal restoration circuit according to the first embodiment. FIG. 2 is a timing-chart illustrating an example of a signal restoration operation. The configuration illustrated in FIG. 1 is an example. Hence, the present invention may not be limited to such a configuration illustrated in FIG. 1.

A signal restoration circuit 2A is an example of the signal restoration circuit disclosed herein. The signal restoration circuit 2A is configured to restore a signal form such as a pulse width of an original signal based on a signal having phase fluctuation. As illustrated in FIG. 1, the signal restoration circuit 2A includes a storage 4 and a storage controller 6.

The storage 4 is configured to store an input signal IN. The storage 4 is configured to dispose the input signals IN in an input order, that is, in an order of being input, so as to store the disposed input signals IN in the input order in the storage, and the stored input signals IN are capable of being read from the storage in the disposed order. The storage 4 includes plural storage elements 41, 42, 43, . . . 4N disposed in an array, from which a first input signal (data) is first output. That is, the storage 4 having the plural storage elements includes a first-in first-out (FIFO) system configuration.

The storage controller 6 is configured to control the storage 4. The storage controller 6 is configured to control the delay time from an input of each of the input signals IN is input in the storage 4 to an output of the input signal IN from the storage 4 based on delay information Dinfo in the input signal IN. The delay information Dinfo is attached to each of the input signals IN and quantitatively represents a delay amount of the input signal IN.

The input signal IN is expected to have pulse width fluctuation as illustrated as "A" in FIG. 2. The delay information Dinfo is a signal having a delay amount of the input signal IN at each clock cycle (represented by a broken line in FIG. 2) as illustrated as "B" in FIG. 2.

The input signal IN and the delay information Dinfo are supplied to the storage controller 6. The storage controller 6 causes the input signal IN to be synchronized with a clock (CLK) signal and the synchronized input signal IN to be written in storage elements 41, 42, 43, . . . 4N of the storage 4 in the input order.

The input signal IN synchronized with the CLK signal is output as an output signal OUT after having waited for a certain delay time in compliance with the delay information Dinfo simultaneously acquired along with the input signal IN. For example, in FIG. 2, an input signal A1 input at a point (2) of the CLK signal is output after having elapsed a certain time (i.e., 3 clocks in this case) specified by the delay amount (D1) in the delay information Dinfo.

When a pulse width is narrowed due to the arrival of a subsequent signal being slightly earlier, as illustrated by an input signal A3 input at a point (6) of the CLK signal, a value of the delay information Dinfo is reduced at a point (7) of the CLK signal. Further, when a pulse width is widened due to the arrival of a subsequent signal being slightly delayed, as illustrated at a point (11) of the CLK signal, a value of the delay information Dinfo is increased.

Hence, the storage controller 6 is configured to control delay time Td from an input of the input signal IN in the storage 4 to an output of the input signal Td from the storage 4 as the aforementioned control operation. In this case, when the delay amount D of the input signal IN is large, the delay time Td is reduced, whereas when the delay amount D of the input signal IN is small, the delay time Td is increased. As a result, the output signal OUT is generated from the storage 4 and the output signal OUT has a certain signal width obtained from the input signal IN as illustrated as "C" in FIG. 2. That is, the output signal OUT is a restored original signal having a pulse width.

Figure 3:
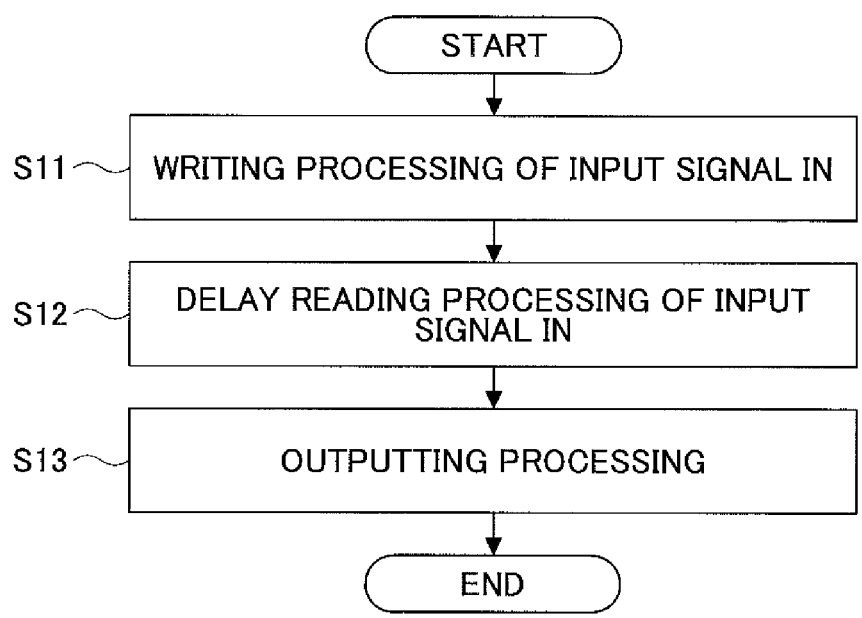
FIG. 3 is a flowchart illustrating an example of a signal restoration procedure.

Next, signal restoration processing is described with reference to FIG. 3. FIG. 3 is a flowchart illustrating an example of a signal restoration procedure.

The procedure is an example of a signal restoration method disclosed in this embodiment. The signal restoration procedure includes writing processing (step S11), delay reading processing (step S12) and outputting processing (step S13).

In the writing processing (step S11), the input signals IN are disposed in an input order so that the input signals IN are stored in the storage in the disposed order. That is, the storage is configured such that the input signals IN are capable of being read from the storage 4 in the disposed order.

In the delay reading processing (step S12), the delay time Td from an input of the input signal IN in the storage 4 to an output of the input signal IN from the storage 4 is controlled based on delay information Dinfo of the input signal IN.

Then, in the outputting processing (step S13), the input signals IN are read from the storage 4 in the disposed order such that the sequentially read input signals IN are generated as the output signals OUT from the storage 4.

With this procedure, since the input signals IN are stored in the input order and a delay time Td from an input of each of the input signals IN in the storage 4 to an output of the input signal IN from the storage 4 is controlled based on the delay information Dinfo attached to the corresponding input signals, the signals may be restored based on the input signals and the delay information.

Second Embodiment

A second embodiment illustrates a configuration example having a specific storage and storage controller.

Figure 4:
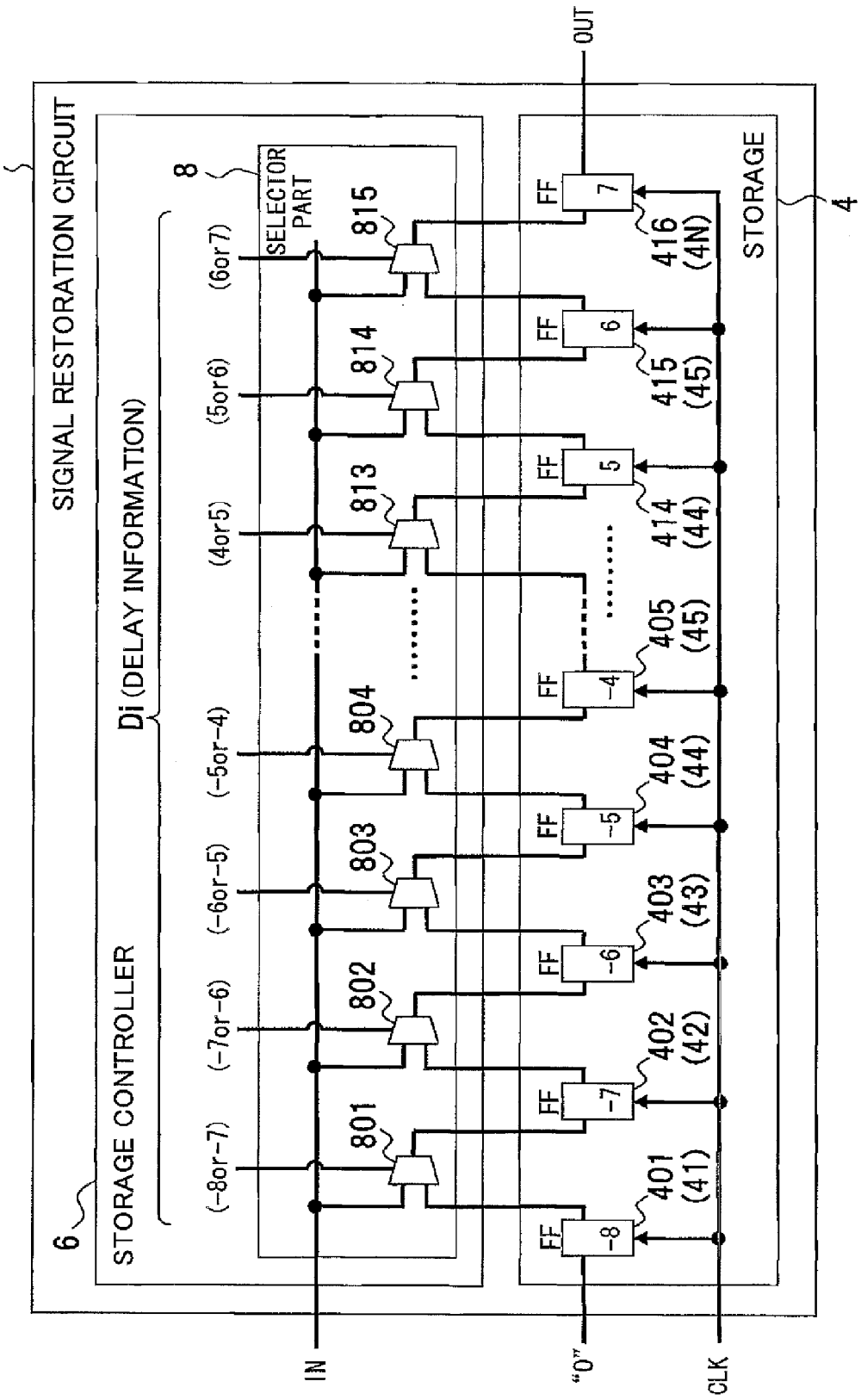
FIG. 4 is a diagram illustrating an example of a signal restoration circuit according to a second embodiment.

The second embodiment is described with reference to FIGS. 4 and 5. FIG. 4 is a diagram illustrating a configuration example of a signal restoration circuit according to the second embodiment. FIG. 5 is a diagram illustrating signal restoration processing. In FIG. 4, components similar to those illustrated in FIG. 1 are provided with the same reference numerals.

A signal restoration circuit 2B includes the storage 4 having disposed 16 flipflops (FFs) 401, 402, 403, . . . 416, and the storage controller 6 having a selector part 8. The selector part 8 includes 15 selectors 801, 802, 803, . . . 815 disposed corresponding to the FFs 401, 402, 403, . . . 416.

In this case, each of the selectors 801, 802, 803, . . . 815 includes a first input part to which the input signal IN is supplied and a second input part to which the output signal OUT is supplied for a corresponding one of the FFs 401, 402, 403, . . . 416. In this embodiment, "0" is supplied to a data input part of the FF 401. Data output from the selector 801 are supplied to a data input part of the FF 402, data output from the selector 802 are supplied to a data input part of the FF 403, and data output from the selector 803 are supplied to a data input part of the FF 404. Data output from the selector 804 are supplied to a data input part of the FF 405, data output from the selector 805 are supplied to a data input part of the FF 406, and data output from the selector 806 are supplied to a data input part of the FF 407. Data output from the selector 807 are supplied to a data input part of the FF 408, data output from the selector 808 are supplied to a data input part of the FF 409, and data output from the selector 809 are supplied to a data input part of the FF 410. Data output from the selector 810 are supplied to a data input part of the FF 411, data output from the selector 811 are supplied to a data input part of the FF 412, and data output from the selector 812 are supplied to a data input part of the FF 413. Likewise, data output from the selector 813 are supplied to a data input part of the FF 414, data output from the selector 814 are supplied to a data input part of the FF 415, and data output from the selector 815 are supplied to a data input part of the FF 416.

Each of the selectors 801, 802, 803, . . . 815 includes a control input part to which a corresponding one of delay signals Di is supplied. The FFs 401, 402, 403, . . . 416 include a clock input part to which a clock (CLK) signal is commonly supplied. Hence, operations of the FFs 401, 402, 403, . . . 416 are synchronized with the CLK signal. The output signal OUT is acquired from the FF 416.

In the signal restoration circuit 2B, if a control is true, the selectors 801, 802, 803, . . . 815 select the input signals IN. The selected signals output from the selectors 801, 802, 803, . . . 815 are supplied to the FFs 401, 402, 403, . . . 416 of the storage 4. If the delay signals Di are a constant value, the input signals IN are input in an input order and the input signals IN are delayed to form a FIFO configuration. Hence, the input signals IN are output as the output signals OUT. If the delay signals Di have transitions, input positions of the FFs 401, 402, 403, . . . 416 at which the input signals IN are supplied may be selected and the selected positions are shifted back and forth. This embodiment includes 16 FFs 401, 402, 403, . . . 416, the input signals IN and the output signals OUT are formed of 16 bits, and the input signals IN are supplied to adjacent 2-bit FFs.

The storage 4 stores a processing table 10A (FIG. 5) in which the input signals IN are stored and from which the output signals OUT are acquired. The processing table 10A presents a processing number column 12, an input signal column 14, a delay signal column 16, a writing position (a signal writing position in FIFO) column 18 of the storage 4, and an output signal column 20. The processing number column 12 presents processing order numbers 0 to 45 as examples of processing sequential numbers. The input signal column 14 presents input signals IN=X, A, B, . . . as examples. The writing position column 18 presents writing positions FF401=–8, FF402=–7, FF403=–6, FF404=–5, FF405=–4, FF406=–3, FF407=–2, FF408=–1, FF409=0, FF410=1, FF411=2, FF412=3, FF413=4, FF414=5, FF415=6, and FF416=7 as example writing positions of the storage 4. The input signals IN=X, A, B, . . . are stored at the respective positions, where "0" represents no input. The output signal column 20 presents output signals OUT=X, A, B, . . . as examples. In the processing table 10A, the processing numbers 0 to 45 change with time.

The input signal IN advances corresponding to 1 clock per line of cells of the processing table 10A. In this case, the identical input signal IN may repeatedly be input twice into the storage 4. The identical signal indicates "A, A", "B, B", "C, C" and the like each of which represents 2 bits. Thus, when the input of the input signal IN is delayed, the input of the input signal IN extends by 1 clock. Hence, a value of the delay signal Di appears to be increased by one at the third bit (e.g., see processing numbers 15 and 18 cases). Further, when the input of the input signal IN advances, the input signal IN shortens by 1 clock. Hence, a value of the delay signal Di appears to be decreased by one in the next input signal (e.g., see processing numbers 25, 26, 35 and 40 cases).

With the above input/output configuration, the input signal IN on the upper stage side is shifted to the right side and the shifted input signal IN are input at positions of the "delay signal Di" and the "delay signal Di−1". In FIG. 5, a bolded box 22 illustrates the cells of the input signals IN and the positions of the input signals IN change with the delay signals Di. That is, the array of the input signals is changed by the delay signals Di such that the input signals IN are input into the storage at positions differing from original positions of the input signals IN in the storage.

Thus, in this embodiment, the output signals OUT are acquired from the FF 416 located at the seventh stage of FIFO constructed in the storage 4. Accordingly, the output signals OUT are generated as restoration signals that are time-controlled based on the delay signals Di.

Further, since the input signals IN are input simultaneously into adjacent 2 bit FFs, restoration accuracy of the signals may be improved for the input signals IN having a narrow width or having a narrow data width such as processing numbers 25 and 28 cases (see FIG. 5). In such cases, an adverse effect of incapability to restore the output waveform due to the input signals being input into only 1 bit may reliably be resolved by the above processing.

Third Embodiment

A third embodiment represents a configuration example of the aforementioned signal restoration circuit disposed in a memory controller.

Figure 6:
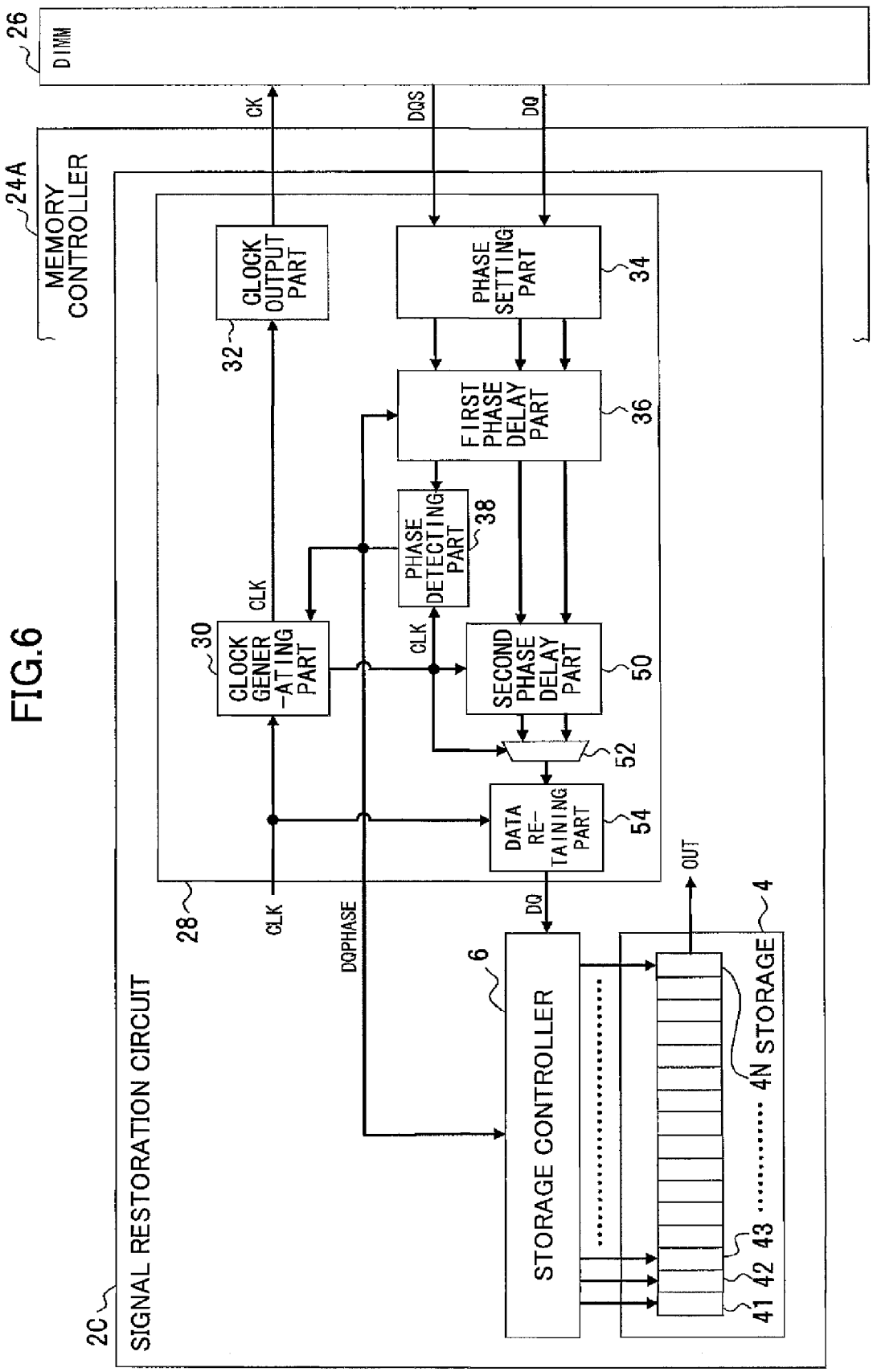
FIG. 6 is a diagram illustrating an example of a memory controller or a memory including a signal restoration circuit according to a third embodiment.

The third embodiment is described with reference to FIG. 6. FIG. 6 is a diagram illustrating a memory controller having a signal restoration circuit, and a memory. In FIG. 6, components similar to those illustrated in FIGS. 1 and 4 are provided with the same reference numerals.

A signal restoration circuit 2C is an example of the signal restoration circuit disclosed herein. The signal restoration circuit 2C is configured to restore a data signal of a dual inline memory module (DIMM) 26. The signal restoration circuit 2C is disposed in a memory controller 24A. The memory controller 24A is configured to control writing of data into the DIMM 26 and reading of data from the DIMM 26. The DIMM 26 is an example of a data source and a signal source.

The signal restoration circuit 2C includes a receiver function for receiving a data signal and a signal restoration function to restore the data signal. As illustrated in FIG. 6 the signal restoration circuit 2C includes storage 4, a storage controller 6 and a signal receiving part 28. The storage 4 and the storage controller 6 are similar to those described in the first embodiment, and hence, their configurations are similar to those illustrated in the second embodiment.

The signal receiving part 28 is configured to generate the CK signal based on the CLK signal and transmit the generated CK signal to the DIMM 26, and is configured to receive a data strobe (DQS) signal serving as a phase reference signal generated from the CK signal and data (DQ) from the DIMM 26. The DIMM 26 is an example of a memory device. The signal receiving part 28 is configured to adjust timing of the DQ signal based on the DQS signal and is further configured to transfer to an internal clock. Thus, the signal receiving part 28 includes a clock generating part 30, a clock output part 32, a phase setting part 34, a first phase delaying part 36, a phase detecting part 38, a second phase delaying part 50, a selector 52 and a data retaining part 54. The phase detecting part 38 forms a delay information detecting-generating unit, and a delay controller is formed of the first phase delaying part 36 and the second phase delaying part 50.

The clock generating part 30 is configured to divide a frequency of the CLK signal generated by an LSI internal clock circuit part (e.g., a clock tree part 306 in FIG. 25) to generate the CK signal having plural phases. In this embodiment, for example, 2 GHz frequency of a CLK signal is divided by four so as to generate CLK signals with 500 MHz. That is, the CLK signals having four phases of 0 degree, 90 degrees, 180 degrees and 270 degrees are generated.

The clock output part 32 is configured to receive the CLK signal having a phase of 270 degrees from the clock generating part 30 and output the generated CLK signal to the DIMM 26. When data are read from the DIMM 26, the DIMM 26 generates a DQS signal based on the CK signal received from the signal receiving part 28, and generates a DQ signal synchronized with the DQS signal. The DQS signal has a phase identical to that of the DQ signal.

The phase setting part 34 is configured to set a phase shift, that is, set a predetermined phase (of 90 degrees) to the DQS signal and the DQ signal. Thus, the phase setting part 34 includes, for example, an input buffer, a delay circuit, an inverter and the like on the DQS signal side, and an input buffer, a delay circuit, FFs and the like on the DQ signal side.

The first phase delaying part 36 is configured to delay a phase of the DQS signal within a range less than 90 degrees as a delay amount of a predetermined phase difference per unit, and also delay a phase of the DQ signal. The first phase delaying part 36 includes a variable delay circuit and is configured to receive a delay signal (DQPHASE) and set a delay amount of less than 90 degrees, which is a threshold of delay capability of the variable delay circuit.

The phase detecting part 38 is configured to compare the CLK signal generated by the clock generating part 30 and the DQS signal from the first phase delaying part 36, and output the DQPHASE signal as information representing the obtained phase difference. The DQPHASE signal is an information signal representing the delay amount of the DQS signal, which is output from the signal receiving part 28 as the delay information as well as being added to the first phase delaying part 36 and the clock generating part 30. The DQPHASE signal is selective information of the CLK signal in the clock generating part 30.

The second phase delaying part 50 is configured to delay a phase of the DQS signal within a range less than 90 degrees as a delay amount of a predetermined phase difference per unit. The second phase delaying part 50 receives the CLK signal from the clock generating part 30 and acquires the DQ signal having a phase delayed by the delay amount of the predetermined phase difference per unit.

The selector 52 is configured to select plural outputs of the second phase delaying part 50. The selector 52 receives the CLK signal from the clock generating part 30 and alternately selects the DQ signal and an inverted DQ signal by utilizing the generated CLK signal as the selective information.

The data retaining part 54 is configured to retain the DQ signal or inverted DQ signal selected by the selector 52. The data retaining part 54 is also configured to serve as a clock transferring unit. Thus, a reference CLK signal added from the clock circuit part within the LSI is added to the data retaining part 54 from the input side of the clock generating part 30. The data retaining part 54 retains the DQ signal or the inverted DQ signal in synchronization with the reference CLK signal, transfers the clock to the reference CLK signal, and outputs the DQ signal or the inverted signal (hereinafter simply called a "DQ signal").

Then, the DQ signal from the data retaining part 54 is input to the storage controller 6, and to be input of the storage 4. Further, the DQPHASE signal acquired by the phase detecting part 38 is input to the storage controller 6 as storage controlling information.

The above signal restoration circuit 2C is configured to regenerate the pulse width of the receiving data from the DQ signal as follows.

The phase of the receive data in the DQ signal is fluctuated by environmental factors such as a power supply voltage and device temperature. Accordingly, the receiving data are fluctuated in a manner similar to the phase of the receiving data after having transferred to the internal clock. In the signal receiving part 28, the DQ signal appears to be normalized by the internal clock signal. However, the receiving data, having transferred to the phase of the internal clock, advances or delays the acquired clock at appropriate timing. Due to this effect, the pulse width may be narrowed or widened by 1 clock width (i.e., tCK/4=inter-phase delay difference in 4 phase clock) simultaneously with the receiving data being transferred to the internal clock.

Thus, in the signal restoration circuit 2C, the storage 4 and the storage controller 6 form a delay controller for delaying the DQ signal (i.e., the input signal IN), which implements regeneration processing of the pulse width of the data. The storage 4 includes the FIFO function capable of sufficiently absorbing delay variability of the data. Hence, the storage 4 may increase or decrease the delay time while passing the signal through the FIFO based on the delay amount held by the DQPHASE signal. Accordingly, the signal restoration circuit 2C may retain constant delay of the receiving signal output from the signal receiving part 28, that is, the DQ signal, and may regenerate the pulse width of the data.

The signal restoration processing 10 is described further in detail. When the delay amount held by the DQPHASE signal is increased (for transferring to the clock), the DQPHASE signal may be caused to pass through the FIFO quickly to reduce that delay amount. Further, when the delay amount held by the DQPHASE signal is decreased, the DQPHASE signal may be caused to pass through the FIFO slowly to increase that delay amount. The predetermined phase of the output data may be maintained by the increase or the decrease of such a delay amount.

Further, the pulse width is regenerated as follows. The narrowed pulse width of the data indicates the phase of the receiving data going faster. In this case, the storage 4 forming the FIFO may need to increase the delay time in passing the signal through the FIFO. Further, the widened pulse width of the data indicates the phase of the receiving data going slower. In this case, the storage 4 forming the FIFO may need to decrease the delay time while passing the signal through the FIFO.

A method for inputting data into the FIFO to widen the narrowed pulse width of the data is described in detail in the first and second embodiments. That is, the input signal IN may be supplied to the adjacent 2 bit latch units, namely, FFs (see FIGS. 4 and 5), and hence, this may eliminate data instability (loss of data) due to the change in the number of phases in the FIFO.

With such an embodiment, the pulse width of the data may be constant. Hence, the output signal OUT generated by the signal restoration circuit 2C may function as a stable receiving signal. That is, the original data signal may be restored precisely.

Fourth Embodiment

A fourth embodiment represents a configuration in which the storage is controlled by adding offset information to the delay information. That is, the fourth embodiment is configured to control the storage by adding the offset information to the first, second and third embodiments.

Figure 7:
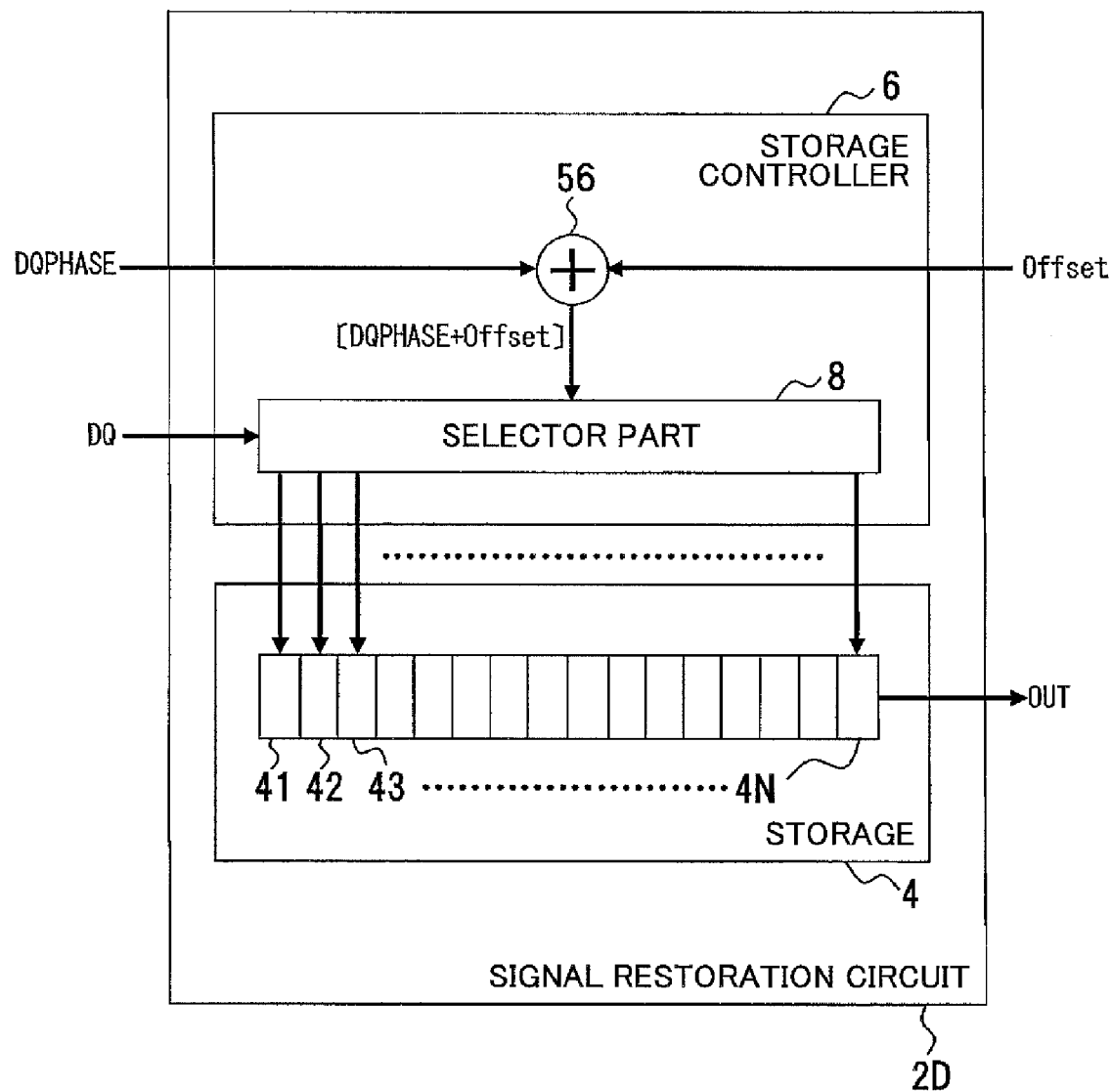
FIG. 7 is a diagram illustrating an example of a signal restoration circuit according to a fourth embodiment.
Figure 8:
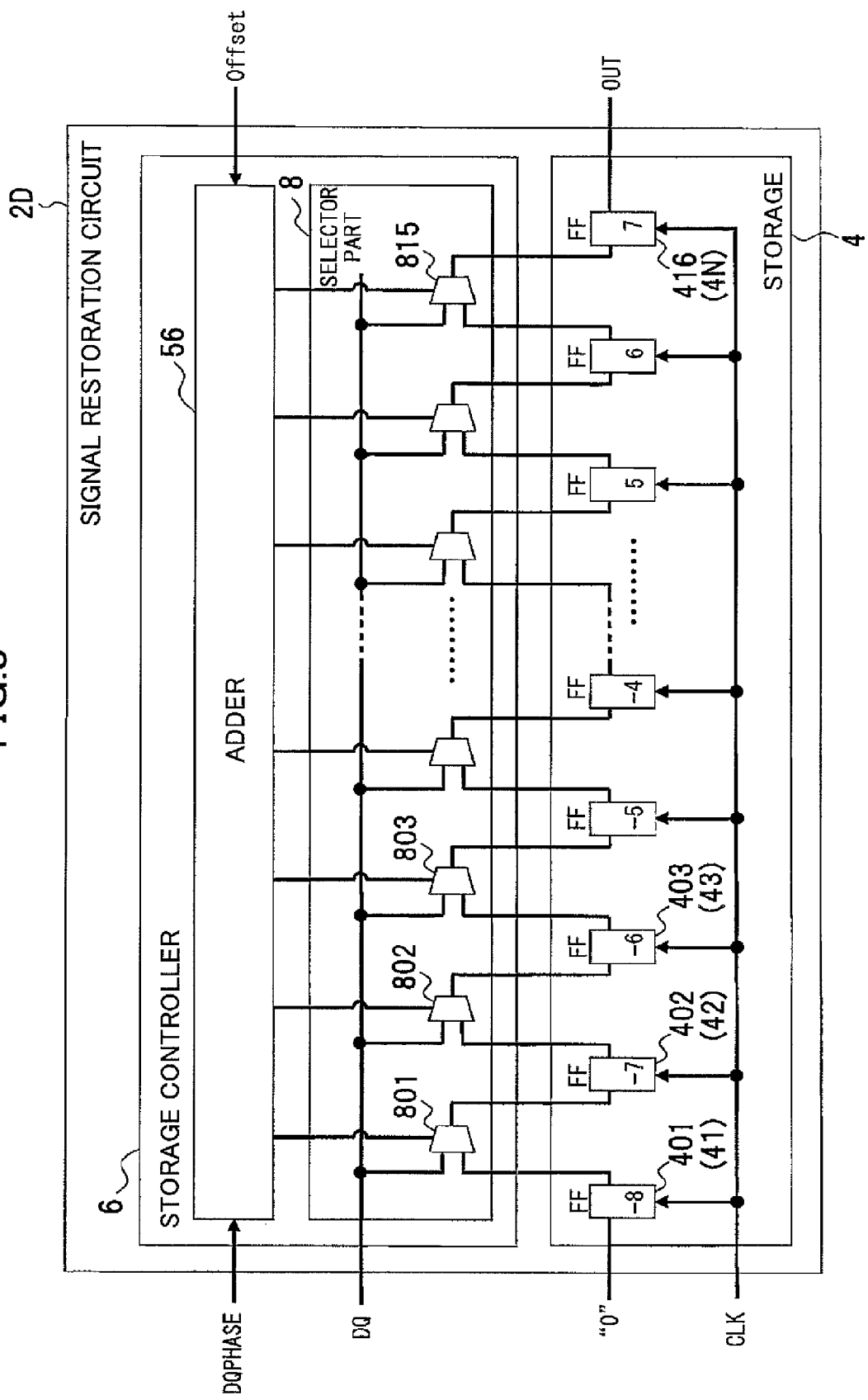
FIG. 8 is a diagram illustrating a configuration example of a signal restoration circuit.

The fourth embodiment is described with reference to FIGS. 7, 8, 9, 10 and 11. FIG. 7 is a diagram illustrating an example of a signal restoration circuit according to the fourth embodiment. FIG. 8 is a diagram illustrating a specific example of the signal restoration circuit. FIGS. 9, 10 and 11 are diagrams illustrating signal restoration processing when the offset signal is added. In FIGS. 7 and 8, components similar to those illustrated in FIG. 1, 4 or 6 are provided with the same reference numerals.

As illustrated in FIG. 7, a signal restoration circuit 2D includes an adder 56 in the storage controller 6. The adder 56 is an example of an arithmetic unit configured to add an offset signal Offset to the aforementioned delay signal DQPHASE. In this embodiment, an offset-added delay signal (DQPHASE+Offset) is added as the delay information to the selector part 8. Other components are the same as those illustrated in the first embodiment (FIG. 1).

The signal restoration circuit 2D is configured as illustrated in FIG. 8, such that the outputs of the adder 56 are selectively input to the selectors 801, 802, 803, . . . 815 of the selector part 8. Further, the FIFO configuration of the storage 4 formed of the FFs 401, 402, 403, . . . 416 is similar to that of the second embodiment (FIG. 4).

In the signal restoration circuit 2D, the adder 56 is configured to output the sum of the delay signal DQPHASE and the offset signal Offset. Thus, the time (the number of clocks) consumed for passing the input signal DQ through the FIFO may be increased or decreased.

In the delay control of the input signal DQ, FIG. 9 illustrates an example of a processing table 10B when the offset signal Offset=0, FIG. 10 illustrates an example of a processing table 10C when the offset signal Offset=1, and FIG. 11 illustrates an example of a processing table 10D when the offset signal Offset=5. In the processing tables illustrated in FIGS. 9, 10 and 11, the processing numbers represent time transition.

The processing tables 10B, 10C and 10D include a processing number column 12, an input signal column 14, a delay signal column 16, a writing position (a signal writing position in FIFO) column 18 of the storage 4, and an output signal column 20. The processing tables 10B, 10C and 10D differ from the processing table 10A (FIG. 5) in that the processing tables 10B, 10C and 10D include an offset signal column 58 and an offset-added delay signal column 60.

The processing number column 12 presents processing order numbers 0 to 45 as examples of processing sequential numbers. The input signal column 14 includes the aforementioned input signals DQ=X, A, B, . . . and the like. In this case, the delay signal column 16 includes the delay signals DQPHASE from the signal receiving part (FIG. 6).

The writing position column 18 of the storage 4 includes settings of the positions FF 401=−8 . . . FF 416=7, which indicate transitions of the signals. The writing positions column 18 includes the input signals DQ=X, A, B, . . . and the like as examples, and the output signal column 20 includes the output signals OUT=X, A, B, . . . and the like as examples.

The offset signal column 58 includes offset signals Offset for being added to the delay signals DQPHASE as the offset information. Further, the offset-added delay signal column 60 includes offset-added delay signals (DQPHASE+Offset), each of which is the sum of the delay signal DQPHASE in the delay signal column 16 and the offset signal Offset in the offset signal column 58.

In each of the cases, the input signal DQ in the upper stage side is shifted to a right side in FIFO and the input signal DQ is input at a position of a "delay signal" and to a position of a "delay signal −1". As a result, the output signal OUT is acquired from the FF 416. Further, 1 clock of the circuit advances per line of the cells in FIGS. 9, 10 and 11. When the input of the input signal DQ is delayed while each of the identical input signals DQ is repeatedly input twice, the input of the input signal DQ extends by 1 clock. Hence, a value of the offset-added delay signal (DQPHASE+Offset) appears to be increased by one at the third bit (e.g., see processing numbers 15 and 18 cases). Further, when the input of the input signal DQ advances, the input signal DQ shortens by 1 clock. Hence, a value of the offset-added delay signal (DQPHASE+Offset) appears to be decreased by one in the next input signal (e.g., see processing numbers 25 and 26 cases).

As illustrated in FIG. 9, when the Offset=0, the delay control is performed in a manner similar to the delay control in FIG. 5. Further, as illustrated in FIG. 10, when the Offset=1, the output signal OUT is output 1 clock faster than the output signal OUT being output when the Offset=0. Further, as illustrated in FIG. 11, when the Offset=5, the output signal OUT is output 5 clocks faster than the output signal OUT being output when the Offset=0, and the output signal OUT is output 4 clocks faster than the output signal OUT being output when the Offset=1.

Fifth Embodiment

A fifth embodiment represents a configuration of a memory controller of the DIMM. The memory controller of the DIMM includes the aforementioned signal restoration circuit and an offset signal setting part to form a latency adjustment circuit of the received signal.

Figure 12:
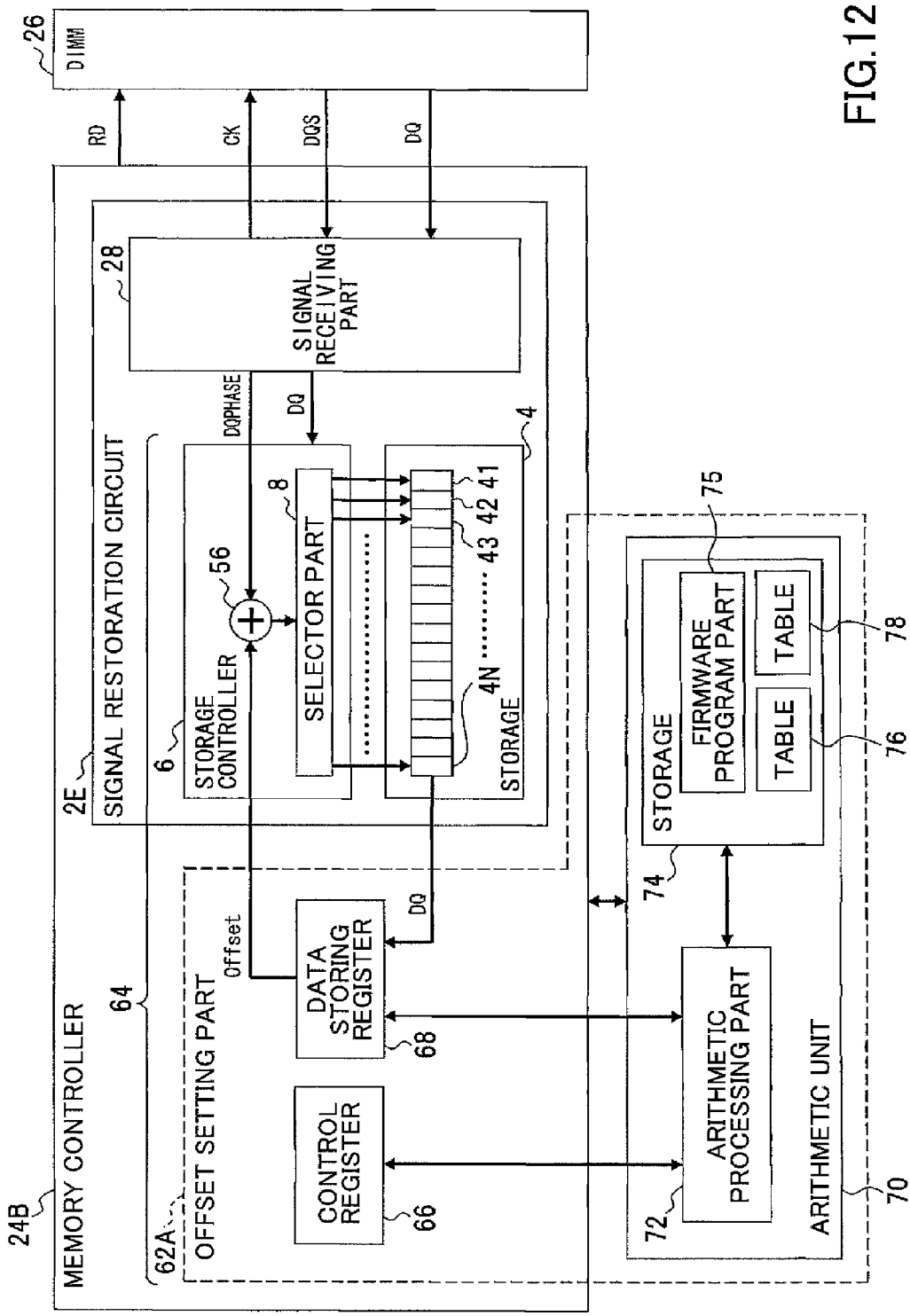
FIG. 12 is a diagram illustrating an example of a latency adjustment circuit according to a fifth embodiment.

The fifth embodiment is described with reference to FIG. 12. FIG. 12 is a diagram illustrating an example of a latency adjustment circuit according to the fifth embodiment. In FIG. 12, components similar to those illustrated in FIGS. 6 and 7 are provided with the same reference numerals.

A latency adjustment circuit 64 is an example of the signal restoration circuit and the latency adjustment circuit disclosed herein. The latency adjustment circuit 64 serves as a signal restoration unit configured to restore a data signal of the DIMM 26 and serves as a latency adjustment unit configured to adjust latency of the receiving data. The DIMM 26 is, as described above, an example of a data source and a signal source.

The latency adjustment circuit 64 is an example of the latency adjustment unit configured to adjust the latency of the receiving signal in the signal receiving part 28. As illustrated in FIG. 12, the latency adjustment circuit 64 includes the storage 4 in a signal restoration circuit 2E, the storage controller 6 and an offset setting part 62A on a memory controller 24B side. In this case, the signal restoration circuit 2E forms an interface part of the memory controller 24B. The storage 4, the storage controller 6, the signal receiving part 28 and the memory controller 24B serve as the aforementioned functions and hence their descriptions are omitted.

The offset setting part 62A is an example of the offset setting unit configured to generate the aforementioned offset signal Offset and set the generated offset signal Offset to the storage controller 6. The offset setting part 62A includes a control register 66, a data storing register 68 and an arithmetic unit 70.

The control register 66 is an example of a time setting unit configured to set a time to write data in the DIMM 26 or a time to acquire data from the DIMM 26. The control register 66 is disposed in the memory controller 24B and controlled by the arithmetic unit 70.

The data storing register 68 is an example of a data storing unit configured to store various types of data for controlling the latency. The data storing register 68 is disposed in the memory controller 24B and additionally serves as an offset data retaining unit. That is, the data storing register 68 also serves as a setting register of the FIFO. Thus, the data storing register 68 is configured to receive the DQ signal from the storage 4, output the offset signal Offset and add the output offset signal Offset to the adder 56 of the storage controller 6.

The arithmetic unit 70 is an example of a delay information detecting unit. In this embodiment, the arithmetic unit 70 is an example of a processor set outside of the memory controller 24B. The arithmetic unit 70 includes an arithmetic processing part 72 and storage 74. The arithmetic processing part 72 is an example of a firmware program executing unit disposed in the storage 74. The storage 74 serves as a storage unit to store the firmware program as well as serving as a data storage unit to store the data. The storage 74 includes a firmware program part 75, a data table 76 (see FIG. 19) and a data table 78 (see FIG. 20). In this embodiment, the storage 74 is disposed inside the arithmetic unit 70. However, the storage 74 may be disposed outside the arithmetic unit 70.

Figure 13:
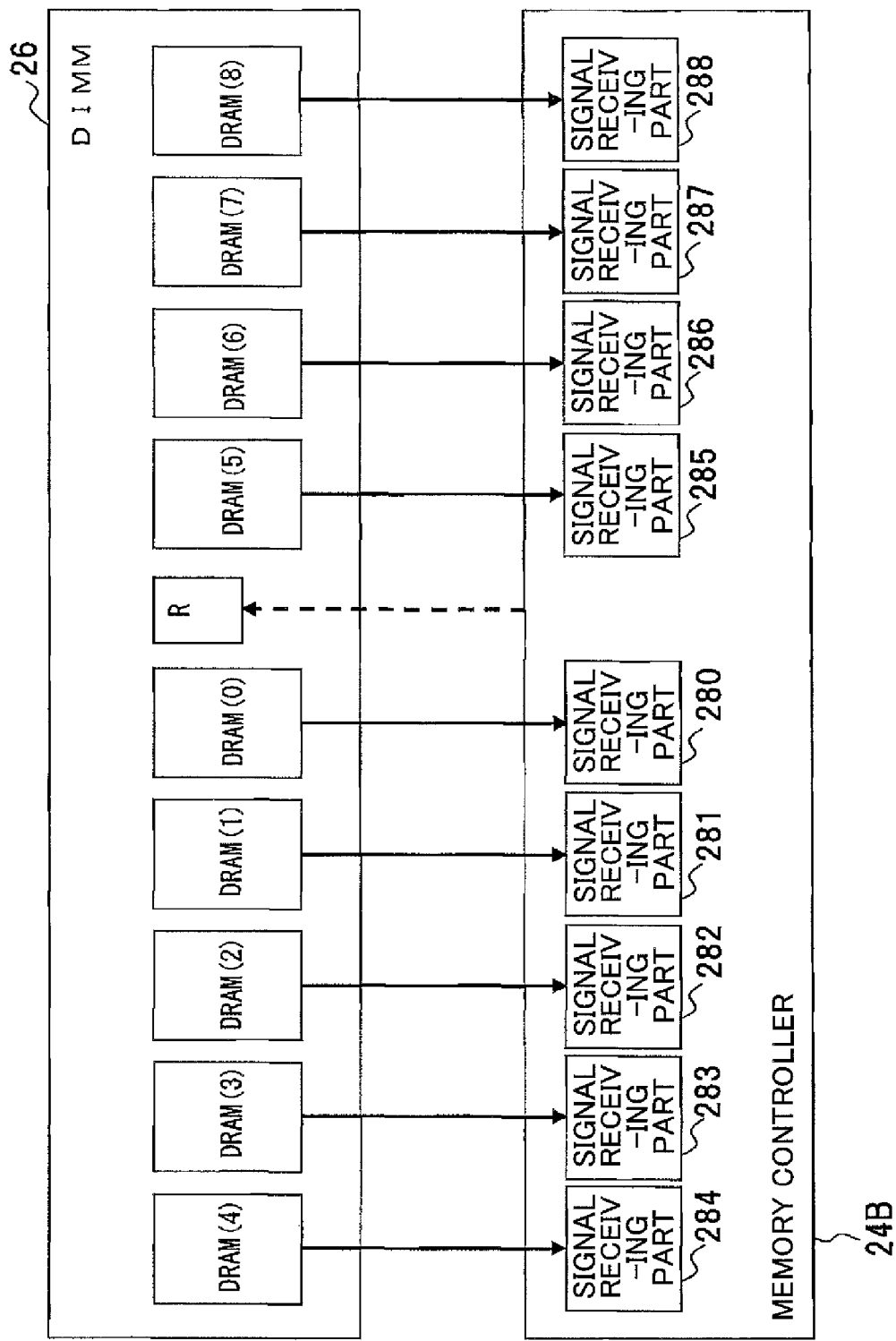
FIG. 13 is a diagram illustrating an example of a DIMM interface part.

The need for the latency adjustment is described with reference to FIG. 13. FIG. 13 is a diagram illustrating a circuit having a DIMM and a memory controller.

The DIMM 26 in this embodiment includes a DRAM (0), a DRAM (1), a DRAM (2), ... a DRAM (8) and a register R as examples of plural memory devices. The memory controller 24B includes plural signal receiving parts 280, 281, 282, ... 288 serving as the aforementioned signal receiving part 28.

The function of the aforementioned FIFO is performed in the signal receiving parts 280, 281, 282, ... 288. Accordingly, the DQS group of the receiving signals of the memory controller 24B acquired via the signal restoration circuit 2E from the DRAM (0), the DRAM (1), the DRAM (2), ... the DRAM (8) may retain a constant delay amount. As a result, the pulse width of the data may be restorable.

However, since the signal receiving parts 280, 281, 282, ... 288 separately receive signals corresponding to the DRAM (0) to the DRAM (8), the delay amounts may vary due to the interface circuit configurations. The latency control may be required for equating the delay amounts. Accordingly, in the memory controller 24B of this embodiment, the data difference between the DQS groups in the signal receiving parts 280 to 288 may be eliminated per clock cycle.

This embodiment includes the offset setting part 62A serving as the interface configured to transmit the offset information from the memory controller 24B to the FIFO. Hence, the storage 4 forming the FIFO is implemented by the storage controller 6 controlling the offset-added delay information. That is, the offset information may be capable of being added to the delay signal from the memory controller side.

Hence, in order to match the latency between the data of the plural DRAMs (0) to (8) of the different DQS groups, predetermined sequential data are written in predetermined sequential addresses of the DIMM 26 and data are sequentially read from the sequential addresses based on the instructions of the arithmetic unit 70 (see FIG. 12). The arithmetic unit 70 is configured to determine an offset value based on sequentially read data content and add the determined offset value to the delay signal.

In the arithmetic unit 70, the latency at reading of the data, namely, a time (delay time) from a time at which a reading command is issued to a time at which the read data are received may be determined based on the content of the sequentially read data. The latency may match the predetermined latency based on the delay time. Further, if the variability range of the latency is limited, an unnecessary amount of latency consumed by the storage 4 forming the FIFO may be eliminated.

Figure 14:
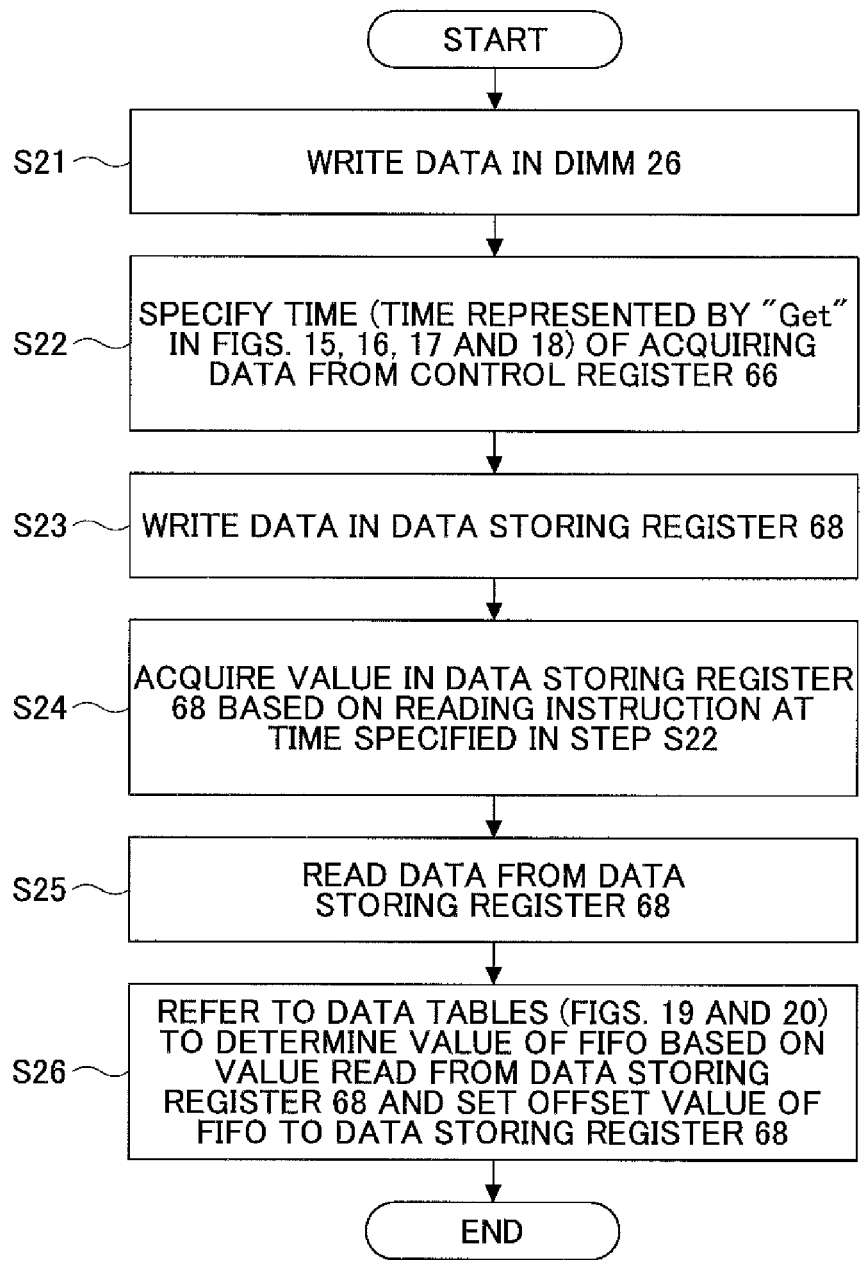
FIG. 14 is a flowchart illustrating an example of a latency adjustment procedure.

Accordingly, in order to adjust the latency, the offset value set to the data storing register 68 may be determined in the memory controller 24B (see FIG. 14).

The latency adjustment procedure is described with reference to FIG. 14. FIG. 14 is a flowchart illustrating an example of the latency adjustment procedure.

The latency adjustment procedure is an example of the latency adjustment method disclosed herein. The latency adjustment procedure is formed of a program to be executed by a computer. The latency adjustment procedure includes detecting latency and adjusting the latency based on the detected latency.

Thus, as illustrated in FIG. 14, the latency adjustment procedure includes causing the memory controller 24B to write data in the DIMM 26 (step S21) based on the instructions of the arithmetic unit 70 that executes the firmware. In this case, the data to be written in the DIMM 26 are data formed of sequential values of 0 to f (see FIG. 15).

The arithmetic unit 70 specifies a time (a time represented by "Get" in FIGS. 15 and 16) of acquiring data from the control register 66 (step S22). When a second time of acquiring the data with a different frequency, the second time of acquiring the data (time represented by "Get" in FIGS. 17 and 18) may be delayed by 1 clock cycle from the first time of acquiring the data.

The arithmetic unit 70 writes "0" in the data storing register 68 (step S23). As described above, the data storing register 68 also serves a setting register of the FIFO forming the storage 4.

The arithmetic unit 70 generates a reading instruction, and the memory controller 24B supplies a value into the data storing register 68 at a time where the arithmetic unit 70 has specified the time in step S22 (step S24).

The arithmetic unit 70 reads data from the data storing register 68 (step S25).

Then, the arithmetic unit 70 refers to a data table 76 (see FIG. 19) and a data table 78 (see FIG. 20) in the storage 74 so as to determine a value of FIFO based on the value read from the data storing register 68, and sets an offset value (delay value) of the FIFO to the data storing register 68 (step S26). When the frequency is different, this processing may be performed while acquiring data for the second time.

Figure 15:
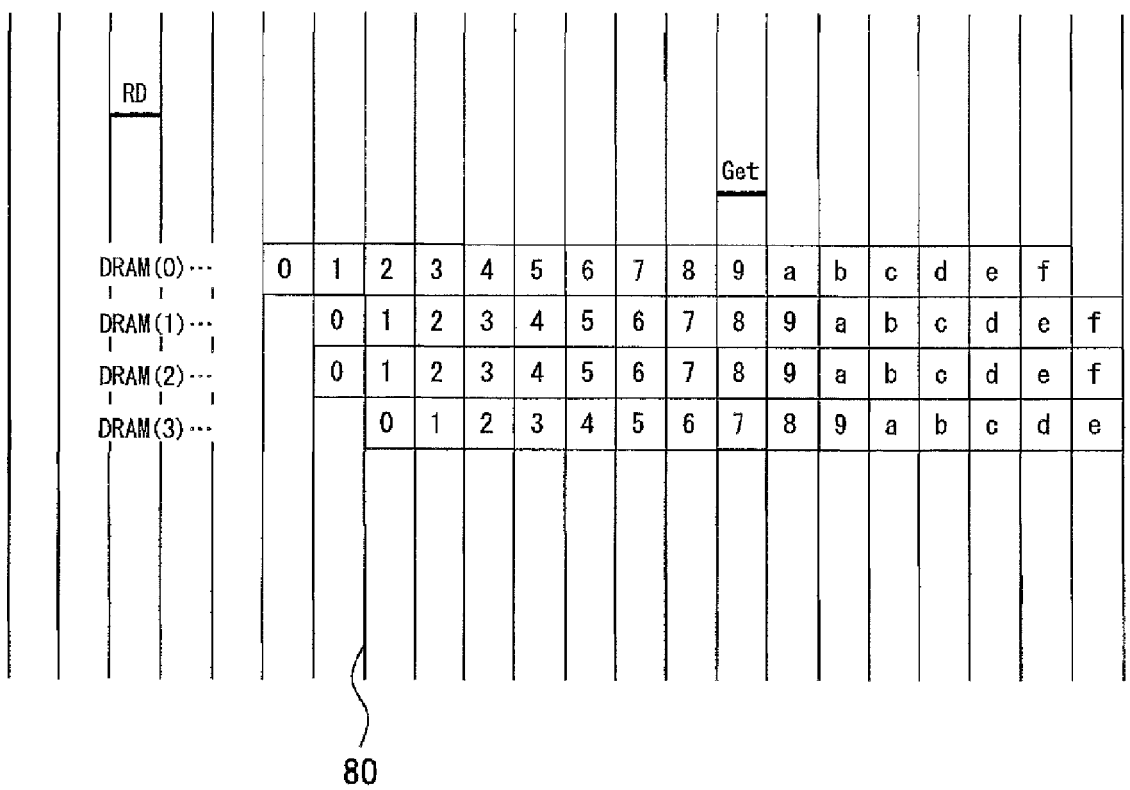
FIG. 15 is a diagram illustrating a state before read latency adjustment.
Figure 16:
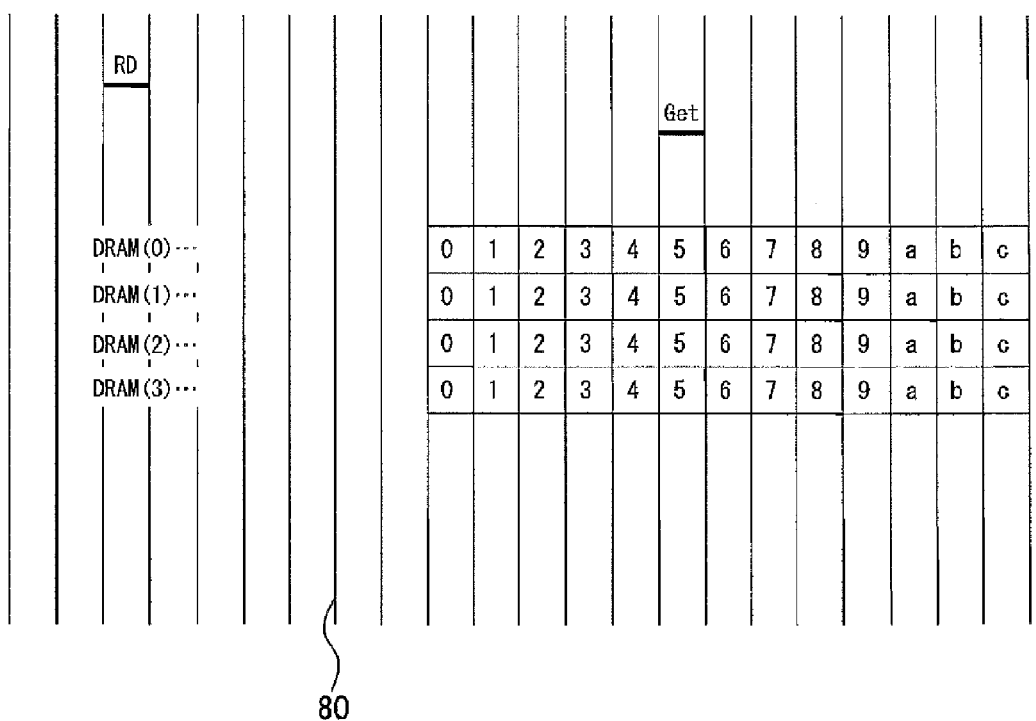
FIG. 16 is a diagram illustrating a state after the read latency adjustment.
Figure 17:
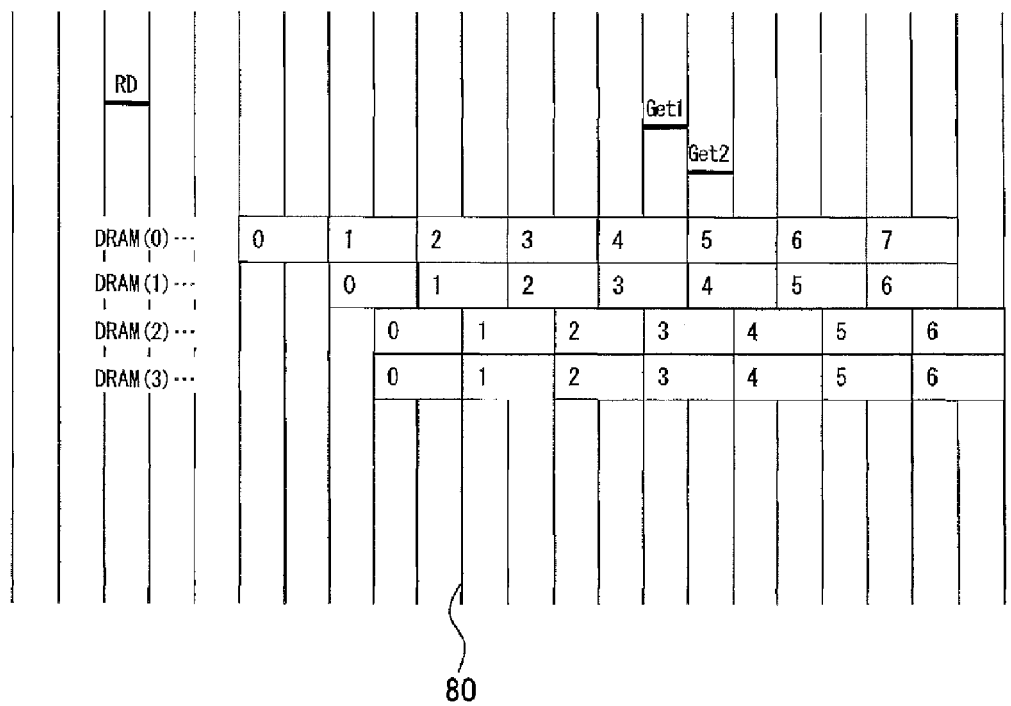
FIG. 17 is a diagram illustrating another state before the read latency adjustment.
Figure 18:
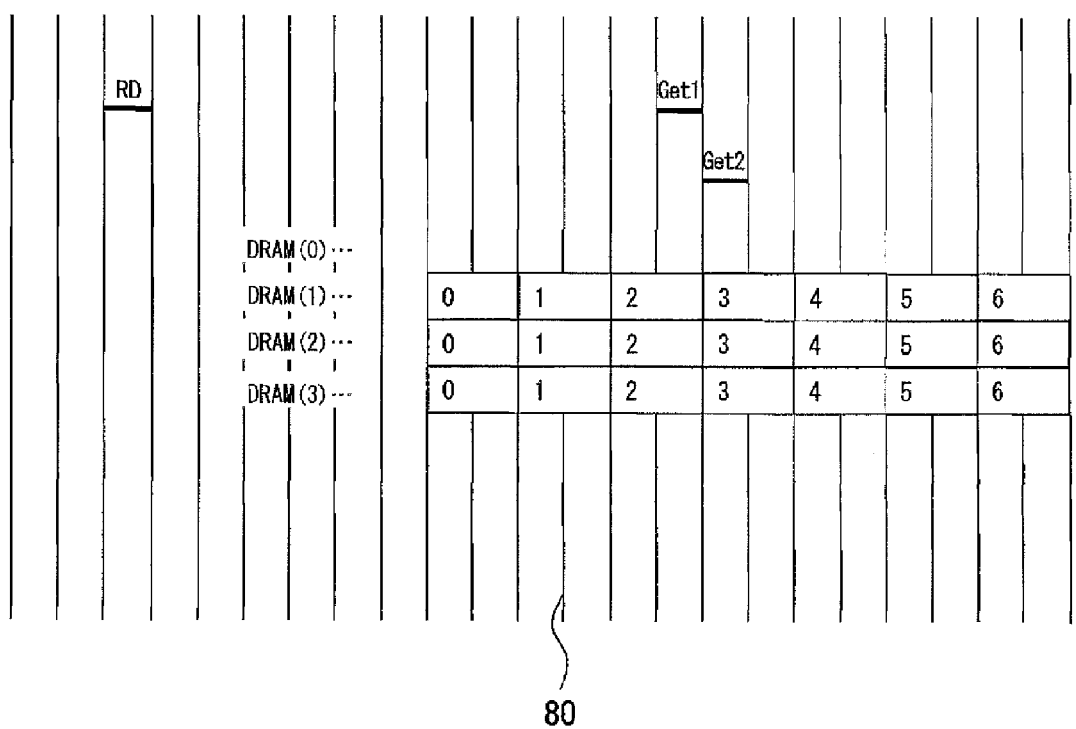
FIG. 18 is a diagram illustrating another state after the read latency adjustment.

The latency adjustment is described with reference to FIGS. 15, 16, 17 and 18. FIGS. 15 and 17 are diagrams illustrating data before the latency adjustment. FIGS. 16 and 18 are diagrams illustrating data after the latency adjustment. In FIGS. 15 to 18, a vertical line 80 indicates the edge of the system clock.

When the relationship between the system clock and the frequency of data in the DIMM 26 is 1:1 as illustrated in FIG. 15, the aforementioned flowchart (FIG. 14) may be executed once. If the relationship between the system clock and the frequency of data in the DIMM 26 is 1:2 as illustrated in FIG. 17, the aforementioned flowchart (FIG. 14) may be executed twice. Further, when the relationship between the system clock and the frequency of data in the DIMM 26, the aforementioned flowchart (FIG. 14) may be executed N times, which may enable the latencies to be aligned (FIGS. 16 and 18).

(1) Data Before Latency Adjustment

When the relationship between the system clock and the frequency of data in the DIMM 26 is 1:1, data read from the DRAM (0), DRAM (1), DRAM (2) and DRAM (3) may be sequentially acquired as illustrated in FIG. 15. When the data acquisition time is a "Get" position in FIG. 15, the data to be acquired are as follows: the DRAM (0)=9, DRAM (1)=8, DRAM (2)=8 and DRAM (3)=7. The data before the latency adjustment, the data are aligned as: DRAM (1)=DRAM (2)=8, however, the data are not aligned as: DRAM (0)=9, the DRAM (3)=7.

Further, when the relationship between the system clock and the frequency of data in the DIMM 26 is 1:2, data read from the DRAM (0), DRAM (1), DRAM (2) and DRAM (3) may be sequentially acquired; however, the data are not aligned.

(2) Data after Latency Adjustment

When the relationship between the system clock and the frequency of data in the DIMM 26 is 1:1, data read from the DRAM (0), DRAM (1), DRAM (2) and DRAM (3) may be aligned after the latency adjustment as DRAM (0)=DRAM (1)=DRAM (2)=DRAM (3)=5 as illustrated in FIG. 16.

Further, when the relationship between the system clock and the frequency of data in the DIMM 26 is 1:2, data read from the DRAM (0), DRAM (1), DRAM (2) and DRAM (3) after the latency adjustment may be sequentially acquired, and the data are aligned as illustrated in FIG. 18. In this case, the data acquisition time may be at a position "Get1" and a position "Get2".

Figure 19:
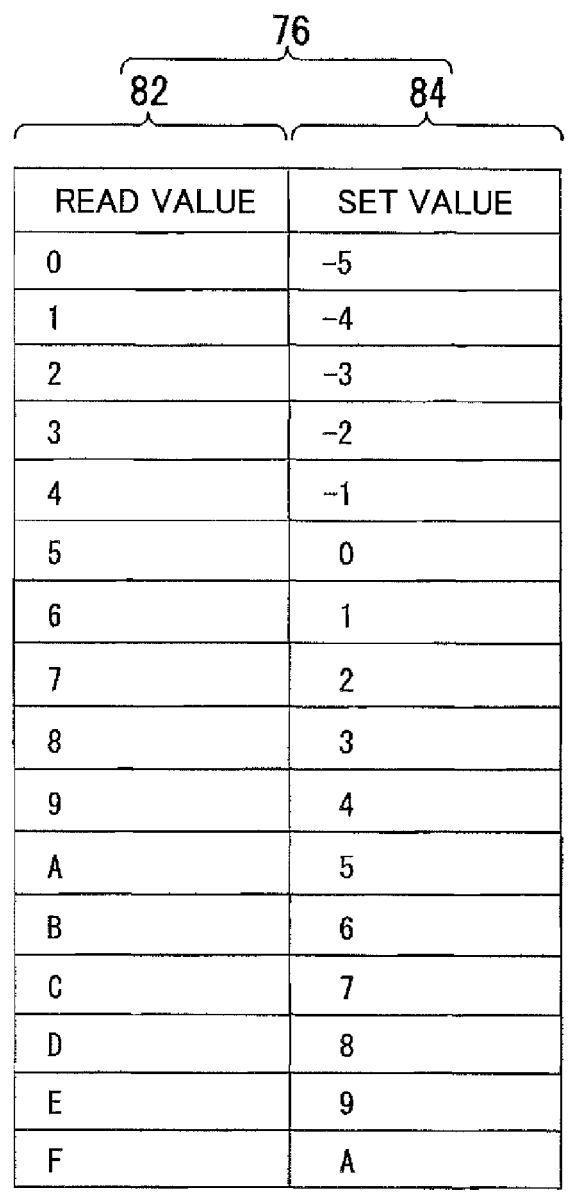
FIG. 19 is a diagram illustrating an example of a correspondence table representing read values corresponding to set values.
Figure 20:
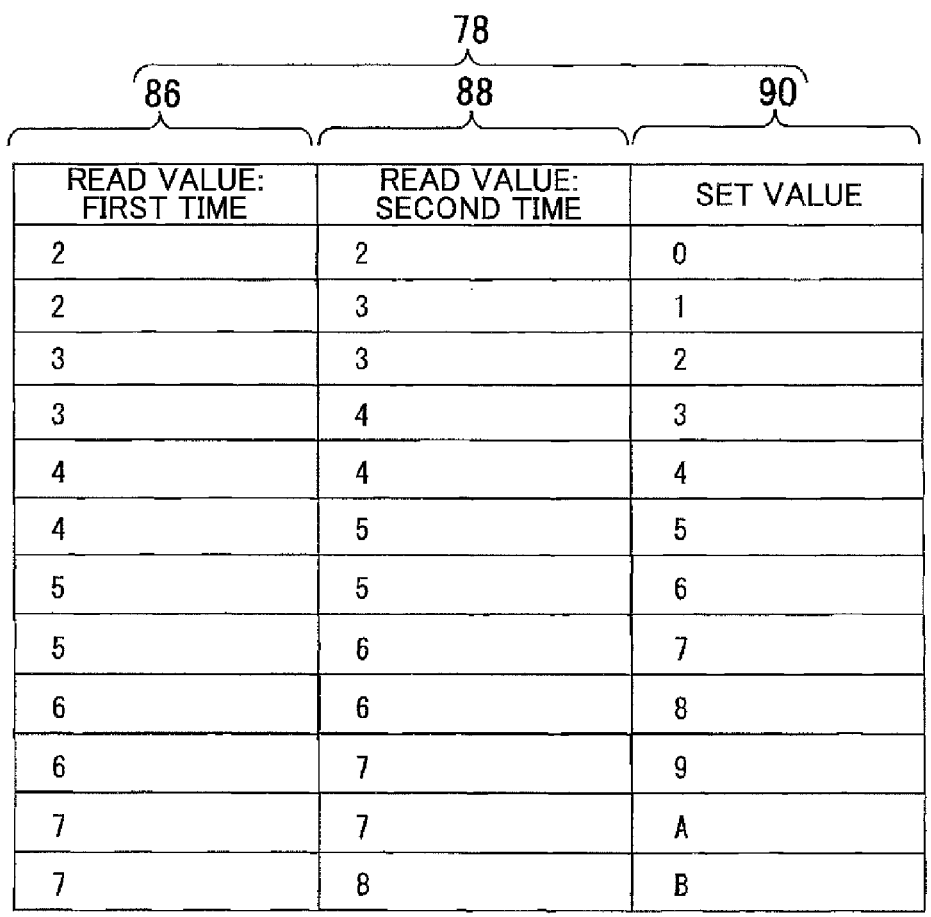
FIG. 20 is a diagram illustrating an example of a correspondence table representing a read value corresponding to a set value.

The data tables 76 and 78 are described with reference to FIGS. 19 and 20. FIGS. 19 and 20 are diagrams illustrating an example of a data table.

As illustrated in FIG. 19, the data table 76 includes a read value 82 and a set value 84 set corresponding to the read value 82. The read value 82 indicates data values read from the DRAM (0), DRAM (1), DRAM (2) and the like at constant timing. The set value 84 indicates values for setting the timing so as to acquire (Get) the read values from the DRAM (0), DRAM (1), DRAM (2) and the like when each of the data value matches a predetermined value of "5". For example, in the DRAM (0), "9" is acquired at the "Get" timing as illustrated in FIG. 15. In this case, "4" of the set value 84 is selected corresponding to the "9" of the read value 82 of the data table 76 (FIG. 19). Accordingly, the "Get" timing of the DRAM (0) may need to be shifted by 4 clocks. This processing represents one example. Hence, if the standard read value is different, another set value may be applied.

The read value 82 is stored in the storage 74 by the execution of the firmware program, and the set value 84 corresponding to the read value 82 is stored. This case represents the system clock being identical to the clock of the DIMM 26.

Further, as illustrated in FIG. 20, the data table 78 includes a set value 90 set corresponding to a read value 86 for the first time and a read value 88 for the second time.

Thus, when the arithmetic unit 70 changes a value specified for the control register 66, namely, the "Get" timing (FIGS. 15 and 16), the timing to align the data may be altered. In this case, when the set value 84 corresponding to the read value 82 of the data table 76 (FIG. 16) is utilized, the "Get" timing may be aligned by the data value "5" as illustrated in FIG. 16. Further, when the set value 90 corresponding to the read value 86 of the data table 78 (FIG. 20) is utilized, the "Get1" timing may be aligned by the data value "2" as illustrated in FIG. 18.

When an error occurs in the signal receiving part 28 side, the error information may be transmitted to the memory controller 24B. When this signal is received by the memory controller 24B, the memory controller 24B tries to read the data again (read-retry) based on the error information. With this method, the accuracy of the offset value may be increased.

The characteristics and advantages of the above-embodiments are described below.

(1) Since the interface of the memory controller 24B includes the signal receiving part 28 and the offset information of the FIFO, a delaying element for the latency adjustment may be omitted from the memory controller 24B. The data difference per system clock may be aligned. The offset value may be obtained with the latency adjustment.

(2) The aforementioned embodiments includes a receiving configuration as the signal restoration circuit to receive the data and the reference signal (DQS) and output a relative delay amount (DQPHASE) corresponding to the internal reference clock and the acquired data. The relative delay amount (DQPHASE) corresponding to the internal reference clock and the acquired data are supplied from the receiving circuit such that latency control for varying an internal delay amount may be performed based on the relative delay amount.

(3) The relative delay amount (DQPHASE) corresponding to the internal reference clock may be handled with a digital amount.

(4) The latency adjustment mechanism may be formed of the FIFO.

(5) The data may be reproduced by inputting identical data into two sequential FFs forming the FIFO.

(6) In the DIMM having data transfer rates exceeding 1 Gbps, the delay variability associated with the data transfer may exceed the data width. Further, the DIMM employs a Fly-by topology in which wires from the internal register to the respective DRAMs are not isometric. Hence, the delay times between the DQS groups are not matched, and the variability in the clock delay may result in 100 ps. In the aforementioned embodiments, the signal receiving part 28 may be formed in order to absorb or cancel such variability exceeding the above clock cycle. Such variability may be absorbed by employing the signal receiving part 28, thereby performing a stable data reading operation.

(7) When the data between the DQS groups of the DIMM 26 are utilized in parallel, the data between the DQS groups after having passed through the signal receiving part 28 may need to be aligned per the system clock. In order to implement such alignment, a delay element such as a data queuing shift register for adjusting the delay may be required within an external circuit of the signal receiving part 28. Further, the latency degradation may not be avoidable as a system. When the delay element is disposed, the physical amount is increased by the amount of the delay element. In addition, the delay variability between the received data may degrade the performance of data processing. Further, when the read error has occurred in the signal receiving part 28, the retry operation may be required, which may not be easily performed. The aforementioned embodiments provide configurations capable of eliminating such disadvantages.

(8) The aforementioned embodiments employ the signal receiving part 28. In the system in which the data difference between the DQS groups may need to be aligned, the output stage of the signal receiving part 28 includes a signal for controlling the number of stages in the FIFO to align the data difference within the interface of the memory controller 24B.

(9) Since the memory controller 24B has a signal indicating the occurrence of the error in the signal receiving part 28, the memory controller 24B may have a function to try to read the data again (read-retry) at the error occurrence, which may improve the reliability of the latency adjustment.

(10) A data transmission device that utilizes the signal receiving part 28 may be formed. In the above data transmission device, the interface of the memory controller 24B has a signal (an offset value) for controlling the number of stages in the FIFO.

(11) In the data transmission device, sequential data are written into the DIMM in an ascending order or a descending order, and the memory controller 24B reads the written data to control the number of stages in the FIFO based on a pattern of the values of the read data.

(12) In the above data transmission device, the interface part of the memory controller 24B may be provided with a signal for transmitting the error information on the signal receiving part 28.

(13) The data transmission device may be provided with a mechanism in which the memory controller 24B refers to a register to store the DIMM access information to request reading of the data again (retry) when the memory controller 24B receives the error information from the signal receiving part 28.

Sixth Embodiment

A sixth embodiment represents a configuration in which a signal restoration circuit and a memory controller are separately formed.

Figure 21:
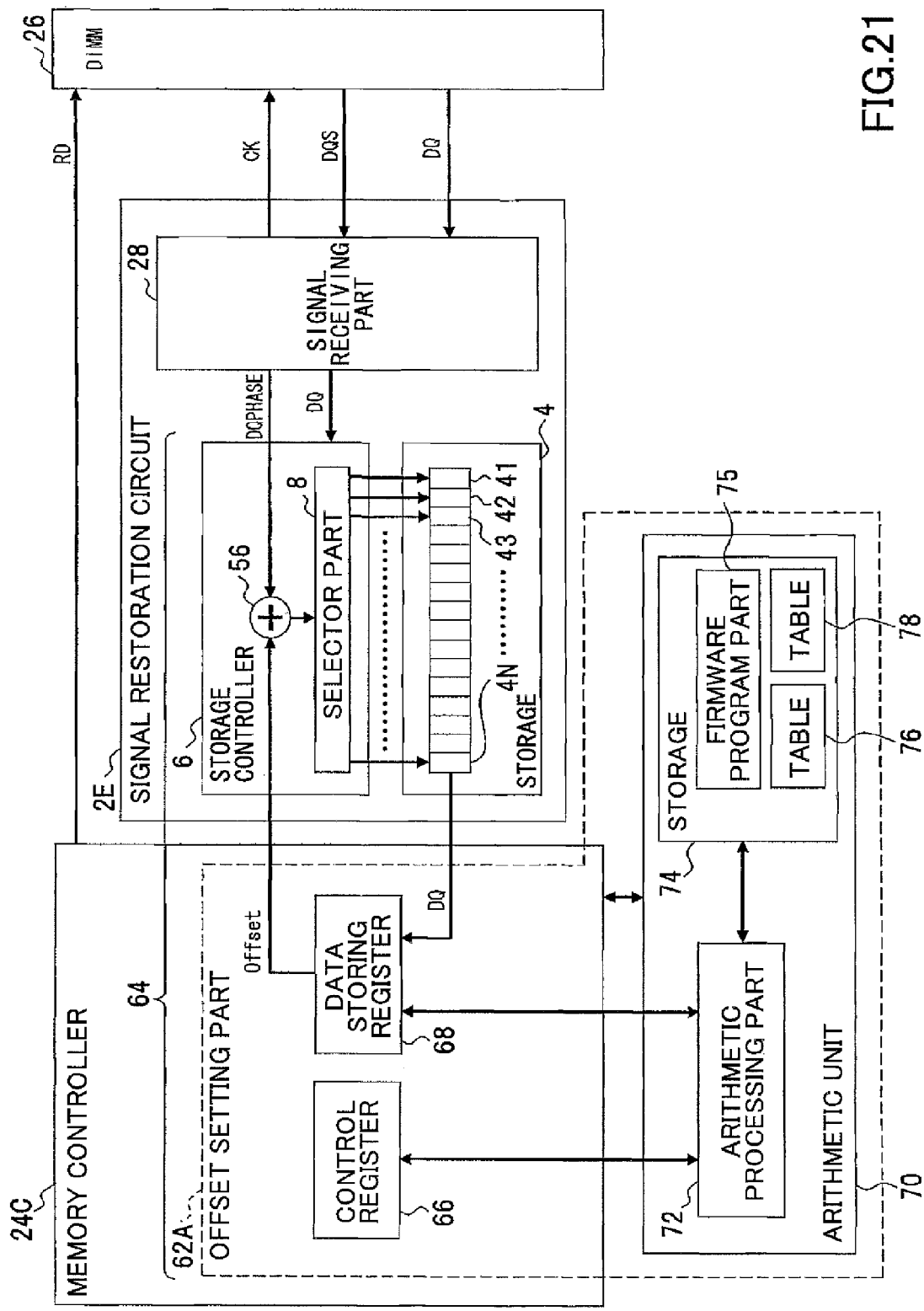
FIG. 21 is a diagram illustrating an example of a latency adjustment circuit according to a sixth embodiment.

The sixth embodiment is described with reference to FIG. 21. FIG. 21 is a circuit diagram illustrating a memory controller, an arithmetic unit, a signal restoration circuit, and a DIMM.

In the sixth embodiment, a signal restoration circuit 2E and a memory controller 24C are separately formed.

The memory controller 24C includes the aforementioned offset setting part 62A. With such a configuration, functions and effects similar to those obtained in the fifth embodiment may be provided. In FIG. 21, components identical to those illustrated in FIG. 12 are provided with the same reference numerals and descriptions of such components are omitted.

Seventh Embodiment

A seventh embodiment represents a configuration in which the memory controller includes a delay amount measuring part for adjusting the latency.

Figure 22:
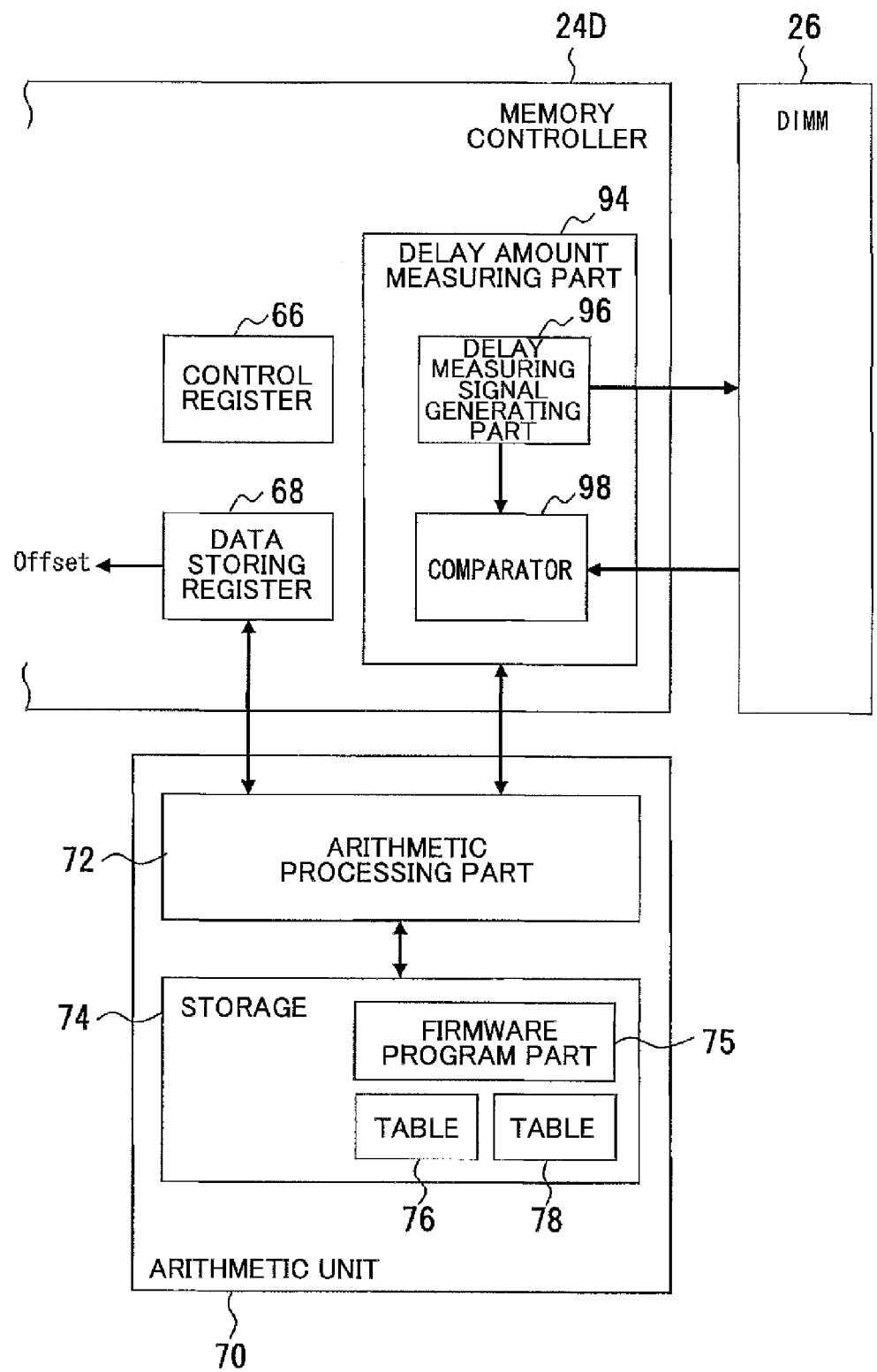
FIG. 22 is a diagram illustrating an example of a latency adjustment circuit according to a seventh embodiment.

The seventh embodiment is described with reference to FIG. 22. FIG. 22 is a circuit diagram illustrating an example of a latency adjustment circuit according to the seventh embodiment. In FIG. 22, components similar to those illustrated in FIG. 12 are provided with the same reference numerals.

The seventh embodiment includes a DIMM 26 and a memory controller 24D, and further includes an arithmetic unit 70 disposed in parallel with the memory controller 24D.

The memory controller 24D in this embodiment includes a delay amount measuring part 94 as well as having the aforementioned control register 66 and the data storing register 68.

The delay amount measuring part 94 is an example of a unit for measuring an offset delay amount. That is, the delay amount measuring part 94 is a delay time measuring unit configured to transmit a delay measuring signal to the DIMM 26, compare the delay measuring signal with the receiving signal and measure a delay time from a time at which the delay measuring signal is transmitted to a time at which the receiving signal is received. The delay time indicates the delay amount. The delay amount corresponds to the offset delay amount, and corresponds to the offset signal Offset.

The delay amount measuring part 94 includes a delay measuring signal generating part 96 and a comparator 98. The delay measuring signal generating part 96 is an example of a delay measuring signal generating unit configured to generate the aforementioned delay measuring signal, and transmit the generated delay measuring signal to the DIMM 26 and also to the comparator 98. The comparator 98 is an example of a delay time measuring unit configured to measure a delay time from a time at which the delay measuring signal is transmitted to a time at which the receiving signal is received. The comparator 98 is configured to compare the delay measuring signal with the receiving signal from the DIMM 26 to measure the delay time from the time of transmitting the delay time measuring signal to the time of receiving the receiving signal. The delay time is acquired in the arithmetic unit 70 and stored as delay information in the data storing register 68.

The arithmetic unit 70 is configured to execute a firmware program in a firmware program part 75 of the storage 74 such that the delay amount measuring part 94 measures the delay amount.

With such a configuration, the offset signal may be generated and the offset value may be input to the adder 56 (FIG. 7) to generate an offset-added delay signal. Accordingly, the latency adjustment of the received signal may be performed based on the generated offset-added delay signal.

In the seventh embodiment, the delay amount measuring part 94 is disposed in the memory controller 24D. However, the delay amount measuring part 94 may be disposed in the signal restoration circuit 2A (or 2B to 2E) for carrying out the aforementioned latency adjustment. The storage 74 may be disposed outside the arithmetic unit 70.

Other Embodiments (1) An example of the signal restoration procedure as the signal restoration method or signal restoration program according to the first embodiment is represented by the flowchart illustrated in FIG. 3. As the signal restoration method or signal restoration program according to the first embodiment, the time control step (or function) may include a step (or function) including storing input signals in the input order, receiving delay information of the input signal and reading the input signals in the input signal disposed order from the readable storage based on the delay information, and a step (or function) including storing the input signals in the input order when the delay information is constant, or selecting positions of the disposed input signals based on the corresponding transitioned delay information when the delay information transitions so as to store the input signals at the selected positions.

(2) The aforementioned signal restoration procedure may further include a step (or function) including comparing an input signal and a reference clock signal, and detecting delay information of the receiving signal corresponding to the reference clock signal.

(3) The aforementioned signal restoration procedure may further include a step (or function) including measuring an offset amount of the receiving signal corresponding to the transmitted delay measuring signal, and a step (or function) including generating delay information based on the offset delay amount and a delay amount detected by the delay amount detecting part and changing the positions of the storage disposition based on the delay information.

(4) In the aforementioned embodiments, as the signal restoration circuit 2E disposed inside the memory controller (FIG. 12) or the signal restoration circuit disposed outside the memory controller 24 (FIG. 21) may be given as an example of the signal restoration circuit; however, the signal restoration circuit disclosed herein may not be limited to the aforementioned embodiments. For example, the signal restoration circuit disclosed herein may be utilized for signal restoration; however, it may be utilized in those other than the memory interface circuit such as the memory controller 24 or the like.

(5) In the aforementioned embodiments, the memory controller 24 is described; however, the memory controller disclosed herein may not be limited to the aforementioned embodiments. For example, a processor 100 (FIG. 23) or a computer 200 (FIG. 24) may be formed by utilizing the memory controller disclosed herein.

Figure 23:
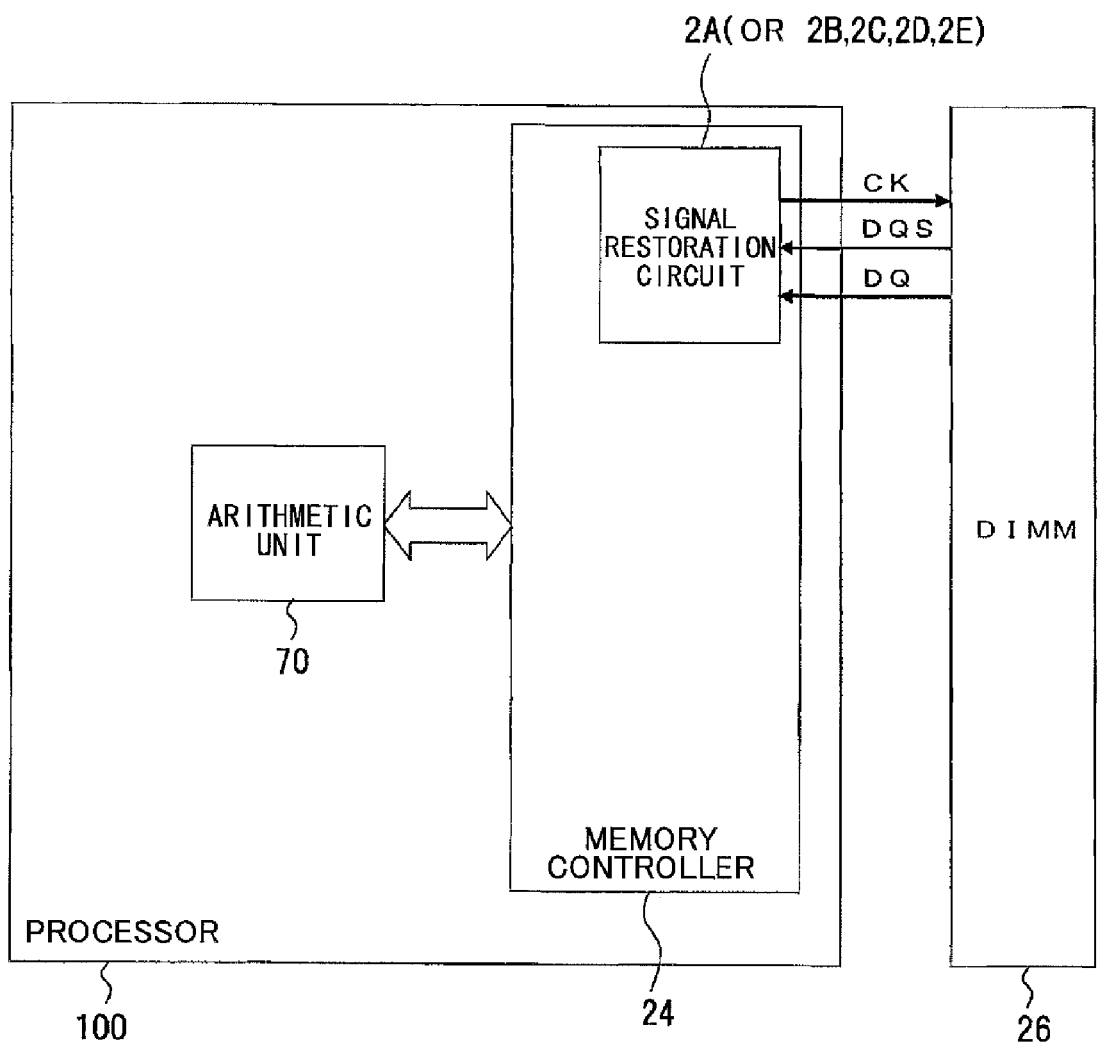
FIG. 23 is a diagram illustrating examples of a processor and a memory according to another embodiment.

(6) The processor 100 may be formed in a central processing unit (CPU) or a micro processor unit (MPU). As illustrated in FIG. 23, the processor 100 may include a memory controller 24 configured to control data transfer of the DIMM 26, a firmware program execution unit configured to execute a firmware program part 75 or an arithmetic unit 70 as an arithmetic processing execution unit. In this case, the signal restoration circuit 2A (or 2B to 2E) may be formed in the memory controller 24. With such a configuration, effects similar to those obtained in the aforementioned embodiments may be provided, which may improve the signal (data) restoration rates or the data transfer rates and the reliability in the signal (data) restoration.

Figure 24:
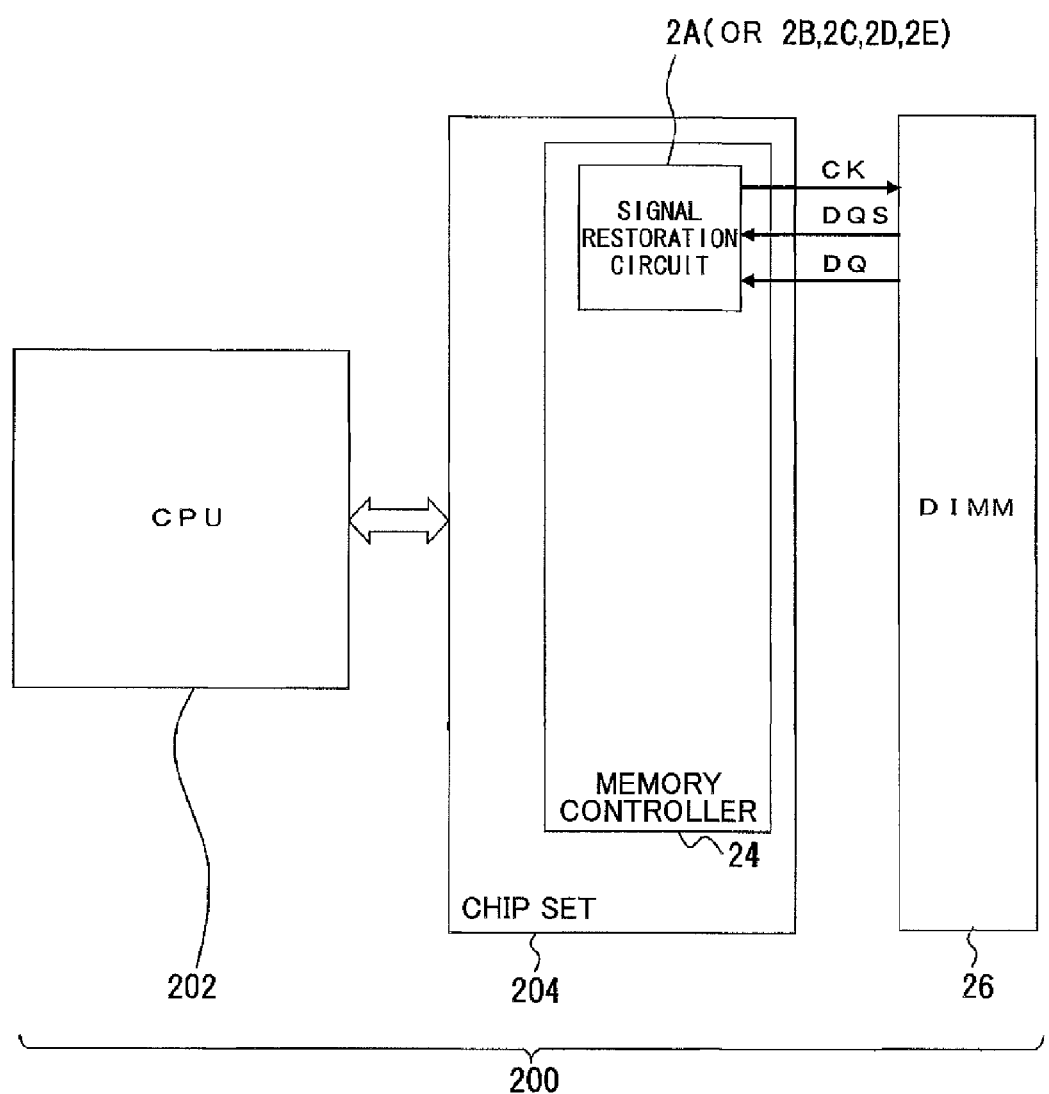
FIG. 24 is a diagram illustrating an example of a computer according to another embodiment.

(7) As illustrated in FIG. 24, the computer 200 may include the memory controller 24 inside a chip set 204 disposed between a CPU 202 and the DIMM 26. In this case, the signal restoration circuit 2A (or 2B to 2E) may be formed in the memory controller 24. With such a configuration, effects similar to those obtained in the aforementioned embodiments may be provided, which may improve the signal (data) restoration rates or the data transfer rates and the reliability in the signal (data) restoration.

(8) The memory controller 24 may be disposed inside the CPU 202 and the signal restoration circuit 2A (or 2B to 2E) may be formed inside the memory controller 24. With such a configuration, effects similar to those obtained in the aforementioned embodiments may be provided, which may improve the signal (data) restoration rates or the data transfer rates and the reliability in the signal (data) restoration.

(9) In the aforementioned embodiments, the internal reference clock signal may be set to the frequency of 2 GHz; however, the internal reference clock signal setting may not be limited to the frequency of 2 GHz. The clock signal may be set to any frequency, and the values specified in the aforementioned embodiments are merely examples.

(10) In the aforementioned embodiments, the signal restoration circuit, the latency adjustment circuit or the like are given as the examples; however, the present invention may not be limited to those examples given in the aforementioned embodiments. When the read data from the plural memory devices are utilized in parallel in an information processing apparatus, the latencies from the respective memory devices may be aligned to the same latency based on the reference clocks of the respective devices. This latency alignment may be utilized in apparatuses and processing that utilize plural memory devices.

COMPARATIVE EXAMPLE

A comparative example represents a signal receiving circuit for a signal with phase fluctuation, which is an example of a signal receiving part of a memory controller.

Figure 25:
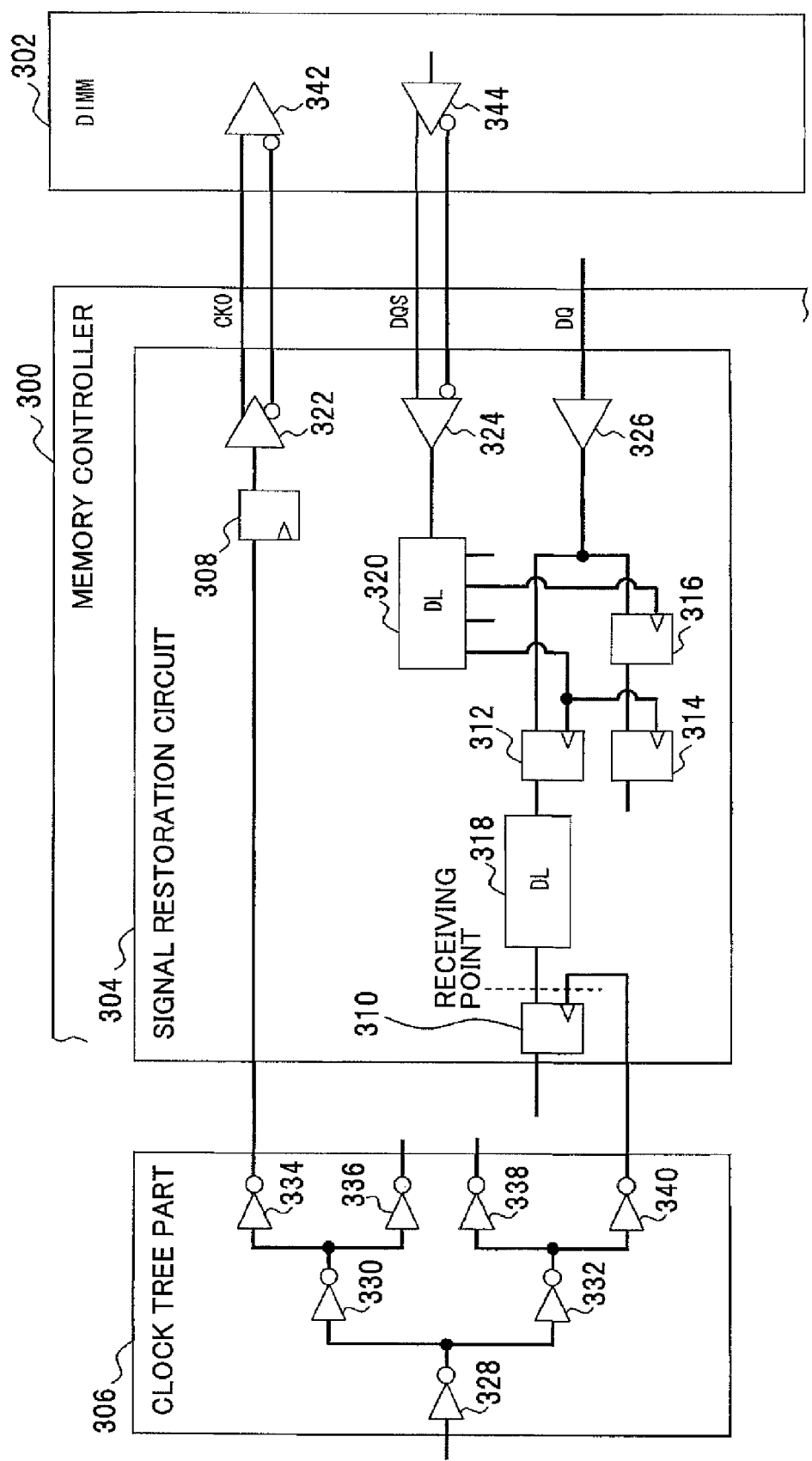
FIG. 25 is comparative examples of a clock-tree part, a memory controller including a signal receiving part and a DIMM.
Figure 27:
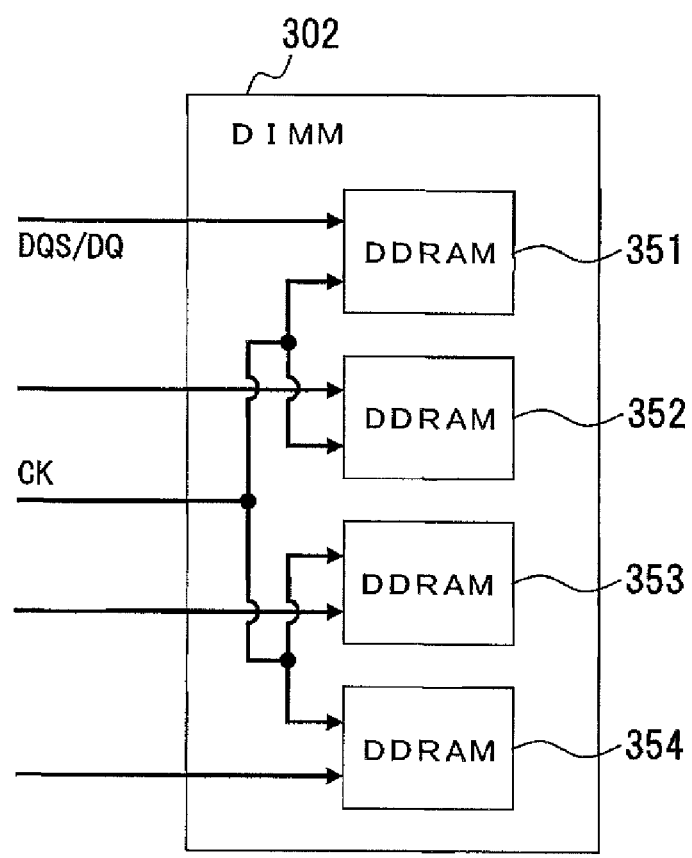
FIG. 27 is a diagram illustrating a clock wiring configuration of a DIMM.
Figure 28:
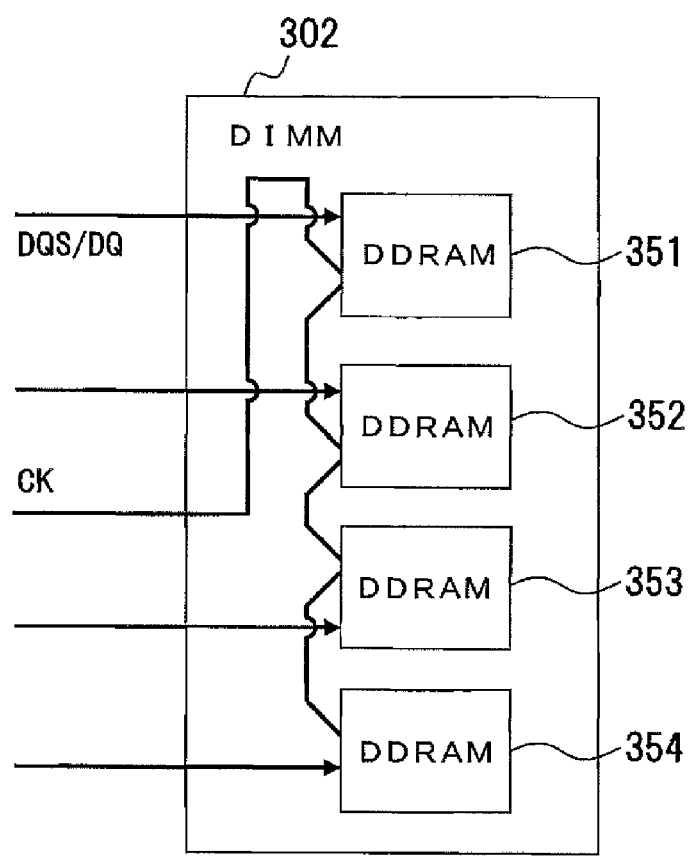
FIG. 28 is a diagram illustrating another clock wiring configuration of a DIMM.

The comparative example is described with reference to FIGS. 25, 26, 27 and 28. FIG. 25 is a diagram illustrating a comparative example of a memory controller. FIG. 26 is a diagram illustrating an estimation example of delay variability of a circuit. FIG. 27 is a diagram illustrating a clock wiring configuration of a DIMM. FIG. 28 is a diagram illustrating another clock wiring configuration of a DIMM.

In order to receive a DDR signal from the DIMM in the simplest manner, a memory controller 300 may be formed as illustrated in FIG. 25. The memory controller 300 includes a signal receiving part 304 as a signal receiving unit configured to receive a signal from the DIMM 302 and a clock tree part 306 as a clock signal supply unit configured to supply a clock to the signal receiving part 304. The clock tree part 306 and the signal receiving part 304 are formed of large-scale integrations (LSIs).

In this case, the signal receiving circuit 304 is configured to receive a signal with a fluctuating phase of input data and to form a signal receiving circuit of the DDR memory interface circuit. The signal receiving part 304 includes FF circuits 308, 310, 312, 314 and 316, DLs 318 and 320, an output buffer 322, an input buffers 324 and 326. The clock tree part 306 forms an LSI internal clock circuit part. The clock tree part 306 includes inverters 328, 330, 332, 332, 334, 336, 338 and 340. The DIMM 302 includes an input buffer 342 and an output buffer 344.

The signal receiving part 304 receives a CLK signal generated by the clock tree part 306, generates a CK signal CK0 and transmits the CK signal CK0 to the DIMM 302. The DIMM 302 generates a DQS signal from the CK signal and sends the DQS signal together with the DQ signal back to the signal receiving part 304. The signal receiving part 304 fetches the DQ signal based on the DQS signal and further transfers to an internal clock. At this moment, it may be necessary for a timing relationship between the internal clock signal and a receiving data signal to fall within a certain range in order to receive the data signal securely at a receiving point of a latch circuit.

Factors inducing the delay variability in the signal receiving part 304 may be various as illustrated in FIG. 26. In this case, all the factors are taken into account. Specifically, it is assumed that the signal receiving point is set at an input part of the FF 310 on an output side of the DL 318 (FIG. 25). Even if the transmission length is 0 mm, the received data may have the delay variability of 982 to 4,156 ps in view of the clock reference of the signal receiving point of the latch circuit within the LSI forming the signal receiving part 304. If this range (3,174 ps) is greater than the clock cycle, and the transmission length is also greater than the data width (1 GT/s), the data width may result in 1,000 ps. The delay variability may not necessarily be due to the manufacturing factors alone. The factors of the delay variability may include environmental factors (a power supply voltage or a device temperature), which indicate that the phase of the receiving data may jitter during operation.

In the DDR interface, the CK signal is supplied to the DRAMs 351, 352, 353 and 354 that form the DIMM 302 via isometric star wiring as illustrated in FIG. 27. By contrast, in the DDR3 interface, a clock wiring method called "Fly-by topology" (FIG. 28) is newly employed. In the Fly-by topology, the CK signal is sequentially supplied to the DRAMs 351, 352, 353 and 354 as illustrated in FIG. 28. In the Fly-by topology, waveform quality of the signal may be improved. However, the data transmission and data receiving timing do not match between the DQS groups. Up to 1000 ps of the clock delay variability may be expected in the Fly-by topology. This may be a considerable value for the clock delay compared to the signal transmission rates.

For the timing discrepancy between the CK signal and DQS signal at the time of transmitting data, a process of absorbing the variability is defined in the "Write Leveling" of the joint electron devices engineering council (JEDEC) standard. However, there is no definition described in the JEDEC standard regarding the timing discrepancy at the time of receiving the signals.

The signal restoration circuit, the memory controller, the processor, the computer or the signal restoration method disclosed herein has proposed a technique for aligning the data timing by adjusting the data latency between the DRAMs as well as absorbing the aforementioned delay variability in the DD3 interface. According to the embodiments described above, the aforementioned disadvantageous effect may be eliminated.

As described above, the signal restoration circuit, the latency adjustment circuit, the memory controller, the processor, the computer, the signal restoration method and the latency adjustment method disclosed herein may not be limited to those described above. The embodiments of the invention described so far are not limited thereto. Various modifications and alterations may be made by those skilled in the art based on the gist of the disclosed embodiments within the scope of the inventions described in the claims. Such modifications and alterations shall of course fall within the scope of the invention.

The disclosed signal restoration circuit, latency adjustment circuit, memory controller, processor, computer, signal restoration method, and latency adjustment method provide the following effects.

(1) Since the input signals are stored in an input order and delay time from an input of each of the input signals in the storage to an output from the storage is controlled based on delay information attached to the corresponding input signal, signal processing such as signal restoration processing may be performed based on the corresponding input signal and the delay information.

(2) When the input signals are data pulse signals, signal restoration or latency adjustment capable of adjusting the restored signals to exhibit a constant pulse width may be performed.

The disclosed signal restoration circuit, latency adjustment circuit, memory controller, processor, computer, signal restoration method and latency adjustment method pertain to signal reception and control of delay variability in the circuits, which may be capable of aligning the latencies of the received data to provide a memory controller and the like that exhibit high applicability and usability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present disclosure have been described in detail, it should be understood that various changes, substitutions, and alterations could be made hereto without departing from the spirit and scope of the invention.

What is claimed is:

1. A signal restoration circuit comprising:
   a storage configured to store input signals by disposing the input signals in an input order, the input signals being readable from the storage in the disposed order; and a storage controller configured to control delay time from an input of the input signals to an output in the storage based on delay information, wherein the delay information is attached to each of the input signals and quantitatively represents a delay clock time of each of the input signals.

2. The signal restoration circuit as claimed in claim 1, wherein when a delay amount of the input signals is large, the storage controller reduces the delay time, and when the delay amount of the input signals is small, the storage controller increases the delay time.

3. The signal restoration circuit as claimed in claim 1, wherein the storage controller receives the delay information of the input signals, and reads the input signals from the storage in the disposed order based on the delay information, and wherein when the delay information is constant, the storage controller causes the storage to store the input signals in the input order, or when the delay information transitions, the storage controller selects positions of the disposed input signals based on the transition to cause the storage to store the input signals at the selected positions.

4. The signal restoration circuit as claimed in claim 1, further comprising:

a delay information detecting part configured to compare the input signals and a reference clock signal, and detect a delay amount of the input signals corresponding to the reference clock signal.

5. The signal restoration circuit as claimed in claim 4, further comprising:

an offset delay amount measuring part configured to measure an offset delay amount of a received signal corresponding to a transmitted delay measuring signal, wherein the storage controller generates the delay information including the offset delay amount and the delay amount detected by the delay information detecting part.

6. The signal restoration circuit as claimed in claim 1, wherein the input signals are data signals received from a memory.

7. The signal restoration circuit as claimed in claim 1, wherein the storage is a first-in first-out (FIFO) capable circuit formed of two or more flipflops, and identical data are input to two adjacent flip-flops.

8. A latency adjustment circuit comprising:

the signal restoration circuit as claimed in claim 1, wherein latency of read data in each of memory devices is adjusted by utilizing the signal restoration circuit.

9. A memory controller comprising:
the latency adjustment circuit as claimed in claim 8.

10. A processor comprising:
the latency adjustment circuit as claimed in claim 8.

11. A computer comprising:
the latency adjustment circuit as claimed in claim 8.

12. A processor, comprising:
a memory controller, said memory controller comprising the latency adjustment circuit recited in claim 8.

13. A computer, comprising:
a memory controller, said memory controller comprising the latency adjustment circuit as claimed in claim 8.

14. A computer, comprising:
a processor, said processor comprising the latency adjustment circuit as claimed in claim 8.

15. A signal restoration method comprising:

storing input signals in a storage by disposing the input signals in an input order, the stored input signals being readable from the storage in the disposed order; and controlling a delay time from an input of the input signals to an output in the storage based on delay information, wherein the delay information is attached to each of the input signals and quantitatively represents a delay clock time of each of the input signals.

16. The signal restoration method as claimed in claim 15, further comprising:

receiving the delay information of the input signals and reading the input signals in the disposed order from the storage based on the delay information; and storing, when the delay information is constant, the input signals in the input order, or selecting, when the delay information transitions, positions of the disposed input signals based on the transition to store the input signals at the selected positions.

17. The signal restoration method as claimed in claim 15, further comprising:

comparing the input signals and a reference clock signal, and detecting, by a delay amount detecting part, a delay amount of the input signals corresponding to the reference clock signal.

18. The signal restoration method as claimed in claim 17, further comprising:

measuring an offset amount of a received signal corresponding to a transmitted delay measuring signal; and generating the delay information based on the offset amount and the delay amount detected by the delay amount detecting part, and changing positions of the stored input signals based on the delay information.

19. A latency adjustment method comprising:

the signal restoration method as claimed in claim 15 to adjust latency of read data in each of memory devices.

* * * * *